United States Patent
Mathew et al.

(10) Patent No.: US 10,784,144 B2
(45) Date of Patent: *Sep. 22, 2020

(54) SLIT STRESS MODULATION IN SEMICONDUCTOR SUBSTRATES

(71) Applicant: Intel Corporation, Santa Clara, CA (US)

(72) Inventors: James Mathew, Boise, ID (US); Yunjun Ho, Boise, ID (US); Zhiqiang Xie, Meridian, ID (US); Hyun Sik Kim, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/897,935

(22) Filed: Feb. 15, 2018

(65) Prior Publication Data

US 2018/0174890 A1 Jun. 21, 2018

Related U.S. Application Data

(63) Continuation of application No. 15/056,620, filed on Feb. 29, 2016, now Pat. No. 9,935,000.

(51) Int. Cl.
*H01L 21/70* (2006.01)
*H01L 21/762* (2006.01)
(Continued)

(52) U.S. Cl.
CPC .. *H01L 21/76232* (2013.01); *H01L 21/02271* (2013.01); *H01L 21/02282* (2013.01);
(Continued)

(58) Field of Classification Search
CPC ......... H01L 21/76205; H01L 21/02271; H01L 21/02282
(Continued)

(56) References Cited

U.S. PATENT DOCUMENTS 6,191,002 B1 2/2001 Koyanagi
7,622,769 B2 11/2009 Smythe, III et al.
(Continued)

OTHER PUBLICATIONS

International Searching Authority, "International Search Report," issued in connection with International Patent Application No. PCT/US2017/015377, dated Apr. 28, 2017, 3 pages.
(Continued)

*Primary Examiner* — Tan N Tran
(74) *Attorney, Agent, or Firm* — Hanley, Flight & Zimmerman, LLC

(57) ABSTRACT

A disclosed example to modulate slit stress in a semiconductor substrate includes a first controller to, after obtaining a wafer stress measurement of the semiconductor substrate, control a first process to apply a first material to the semiconductor substrate based on the wafer stress measurement, the semiconductor substrate including a slit between adjacent stacked transistor layers, the first material coating walls of the slit to reduce a first width of the slit between the adjacent stacked transistor layers to a second width; and a second controller to control a second process to apply a second material to the semiconductor substrate, the second material to be deposited in the second width of the slit, the first material and the second material to form a solid structure in the slit between the adjacent stacked transistor layers.

21 Claims, 11 Drawing Sheets

(51) Int. Cl.
  *H01L 21/02* (2006.01)
  *H01L 25/00* (2006.01)
  *H01L 25/065* (2006.01)
  *H01L 27/115* (2017.01)
  *H01L 21/66* (2006.01)
  *H01L 21/822* (2006.01)
  *H01L 21/8234* (2006.01)
  *H01L 27/11582* (2017.01)

(52) U.S. Cl.
  CPC .......... *H01L 21/8221* (2013.01); *H01L 22/12* (2013.01); *H01L 22/20* (2013.01); *H01L 22/26* (2013.01); *H01L 25/0657* (2013.01); *H01L 25/50* (2013.01); *H01L 27/115* (2013.01); *H01L 21/823481* (2013.01); *H01L 27/11582* (2013.01)

(58) Field of Classification Search
  USPC ................................. 257/374, 397, 510, 513
  See application file for complete search history.

(56) References Cited

U.S. PATENT DOCUMENTS

| | | | |
|---|---|---|---|
| 7,682,927 B2 * | 3/2010 | Hoshi | H01L 21/02126 257/E21.546 |
| 8,392,592 B2 | 3/2013 | Johnson et al. | |
| 9,484,303 B2 | 11/2016 | Wang et al. | |
| 9,935,000 B2 * | 4/2018 | Mathew | H01L 21/76232 |
| 2005/0287731 A1 | 12/2005 | Bian et al. | |
| 2006/0003596 A1 | 1/2006 | Fucsko et al. | |
| 2006/0246684 A1 | 11/2006 | Hoshi et al. | |
| 2007/0155120 A1 | 7/2007 | Hempel et al. | |
| 2011/0127586 A1 | 6/2011 | Bobde et al. | |
| 2012/0208347 A1 | 8/2012 | Hwang et al. | |
| 2012/0220130 A1 | 8/2012 | Chung | |
| 2013/0307047 A1 | 11/2013 | Sakuma et al. | |
| 2014/0136755 A1 | 5/2014 | Hyde et al. | |
| 2017/0250108 A1 | 8/2017 | Mathew et al. | |

OTHER PUBLICATIONS

International Searching Authority, "Written Opinion," issued in connection with International Patent Application No. PCT/US2017/015377, dated Apr. 28, 2017, 5 pages.

United States Patent and Trademark Office, "Non-Final Office Action," issued in connection with U.S. Appl. No. 15/056,620, dated Jan. 12, 2017, 13 pages.

United States Patent and Trademark Office, "Final Office Action," issued in connection with U.S. Appl. No. 15/056,620, dated Jul. 10, 2017, 18 pages.

United States Patent and Trademark Office, "Advisory Action," issued in connection with U.S. Appl. No. 15/056,620, dated Sep. 25, 2017, 5 pages.

United States Patent and Trademark Office, "Notice of Allowance," issued in connection with U.S. Appl. No. 15/056,620, dated Nov. 17, 2017, 8 pages.

International Bureau, "International Preliminary Report on Patentability," issued in connection with International Patent Application No. PCT/US2017/015377, dated Sep. 13, 2018, 7 pages.

European Patent Office, "Extended European Search Report," dated Oct. 2, 2019 in connection with European Patent Application No. 17760440.2, 10 pages.

* cited by examiner

| 3D GENERATION | STORIES (~0.055 MICRON/STORY) | HARP THICKNESS (ANGSTROM) |
| --- | --- | --- |
| 1ST GENERATION (~2 um high) | 37 | 600 |
| 2ND GENERATION (~4 um high) | 74 | 1050 |
| 3RD GENERATION (~6 um high) | 106 | 1600 |

HARP MATERIAL THICKNESS PARAMETER TABLE

FIG. 2

| 3D GENERATION | STORIES (~0.055 MICRON/STORY) | SOD DENSIFICATION TEMP (°C) |
| --- | --- | --- |
| 1ST GENERATION (~2 um high) | 37 | 500 +/- 25 |
| 2ND GENERATION (~4 um high) | 74 | 550 +/- 25 |
| 3RD GENERATION (~6 um high) | 106 | 550 +/- 25 |

SOD DENSIFICATION TEMPERATURE PARAMETER TABLE

FIG. 3

| 3D GENERATION | STORIES (~0.055 MICRON/STORY) | SOD DENSIFICATION TIME (hours) |
| --- | --- | --- |
| 1ST GENERATION (~2 um high) | 37 | 4 - 6 |
| 2ND GENERATION (~4 um high) | 74 | 4 - 6 |
| 3RD GENERATION (~6 um high) | 106 | 6 - 8 |

SOD DENSIFICATION TIME PARAMETER TABLE

FIG. 4

PINCH-OFF DEFECT

VOIDS PROPAGATING DEFECTS TOWARD BACK-END-OF-LINE (BEOL) PROCESSING

BLOWOUT DEFECT FROM PRIOR
SLIT FILL TECHNIQUES

BIVARIATE FIT OF PERCENTAGES OF FAILS
FOR BIN XD BY POST-BUFF BOW

US 10,784,144 B2

SLIT STRESS MODULATION IN SEMICONDUCTOR SUBSTRATES

RELATED APPLICATIONS

This patent arises from a continuation of U.S. patent application Ser. No. 15/056,620, filed on Feb. 29, 2016, which is hereby incorporated herein by reference in its entirety.

FIELD OF THE DISCLOSURE

The present disclosure relates generally to semiconductor devices and, more particularly, to methods and apparatus to modulate slit stress in semiconductor substrates.

BACKGROUND

Integrated circuits (ICs) in semiconductor devices are fabricated by forming and interconnecting transistors on a semiconductor substrate or wafer. Such semiconductor devices include logic circuits, processors, memory, power circuits, displays, and many other electronic devices. Prior semiconductor devices are fabricated using a 1D (one dimensional) IC configuration in which a single layer of transistors is formed on a semiconductor substrate or wafer to implement one or more ICs by interconnecting the transistors.

As the electronics industry pushes toward better computing and data storage performance while making smaller and lighter electronic devices, circuit board space becomes more limited and weight requirements for electronic components become stricter. To meet these requirements, some semiconductor companies have adopted 3D (three dimensional) IC configurations for manufacturing semiconductor devices. Some 3D IC semiconductor devices are formed by stacking numerous separate chips or 1D dies on one another and using wire bonding, flip chip, or through-silicon via (TSV) interconnect techniques to achieve interconnectivity between the stacked chips or 1D dies. The stacked and interconnected configuration can then be packaged, resulting in a vertical 3D stack chip.

BRIEF DESCRIPTION OF THE DRAWINGS

FIG. 2 is an example high aspect ratio process (HARP) thickness parameter table for controlling chemical vapor deposition (CVD) HARP material deposition.

FIG. 3 is an example spin-on-dielectric (SOD) densification temperature parameter table for controlling SOD material deposition.

FIG. 4 is an example SOD densification time parameter table for controlling SOD material deposition.

Figure 1A:
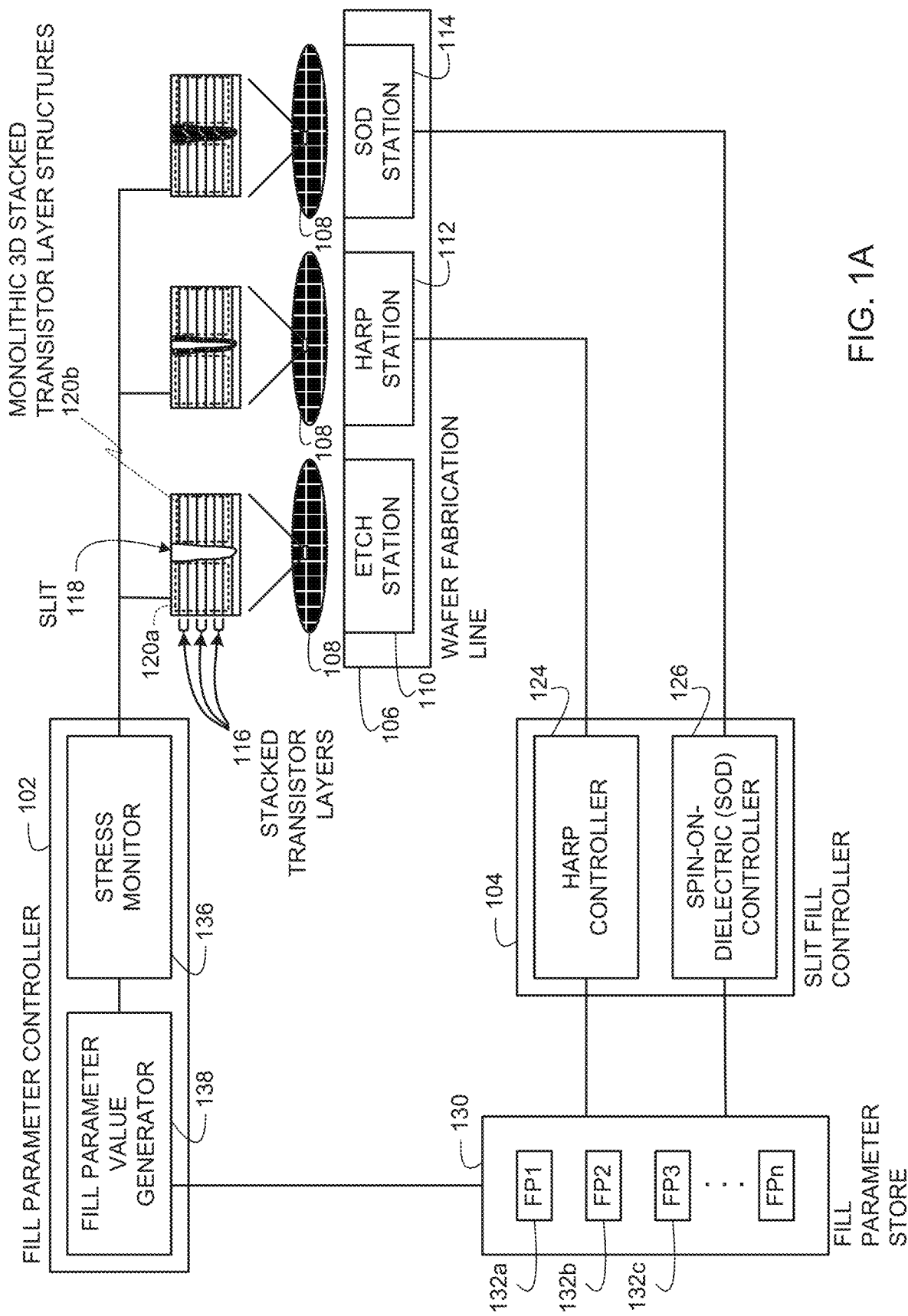
FIG. 1A depicts an example fill parameter controller and an example slit fill controller implemented in accordance with the teachings of this disclosure to fill slit structures formed in semiconductor substrates on a semiconductor wafer fabrication line.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Examples disclosed herein may be used to modulate slit stress in monolithic 3D stacked semiconductor substrates or wafers for integrated circuit (IC) devices. In examples disclosed herein, a semiconductor substrate or wafer is a thin slice of semiconductor material (e.g., a crystalline silicon) on which integrated circuits are fabricated and from which numerous IC die are cut to manufacture electronic IC devices. In monolithic 3D stacked semiconductor substrates, numerous layers of transistors are formed on a single semiconductor substrate. Interconnections can be etched between transistors on the same layer and between transistors on different layers. In some instances, adjacent stacked transistor layer structures need to be isolated from one another when no interconnections are to be formed between transistors in those adjacent structures. In such instances, slit formations are etched between the adjacent stacked transistor layer structures from a top surface of the semiconductor substrate in a direction toward an opposing bottom surface of the semiconductor substrate. In this manner, an air gap or void is created by the slit structure to separate and electrically isolate the adjacent stacked transistor layer structures.

When slit structures are formed, the resulting air gaps or voids must be filled with electrically insulating (non-conductive) material for a number of reasons. An example reason for filling the air gaps or voids of slit structures is to avoid subsequent metallization (e.g., metal deposition processes) from filling the air gaps with conductive material that would create inadvertent connections between the adjacent stacked transistor layer structures, resulting in short-circuit failures. Another example reason to fill the air gaps or voids of the slit structures is to provide a non-conductive vertically supporting structure between the adjacent stacked transistor layer structures. In this manner, the likelihood of shifting or toppling over of stacked transistors in the stacked transistor layer structures is substantially reduced or eliminated. Shifting of stacked transistors can lead to contacts becoming misaligned with corresponding pillars. Yet another example reason to fill the air gaps or voids of the slit structures is to prevent blowouts in the semiconductor substrate fabrication process. For example, if slit structures are not properly filled, overlaying material deposits seal off air gaps or voids in the semiconductor substrates. These air pockets expand in the semiconductor substrates during subsequent high-heat operations. When such expansions occur, the expanded air blows out through one or more layers of material resulting in a structural failure of a portion or all of the semiconductor substrate by damaging the subsequently deposited overlaying materials. In some examples, blown out material can create shorts between circuits or lines such as bitline-to-bitline (BL-BL) shorts in memory circuits.

Some slit structures are deep and can have irregular profiles resulting from sidewall bending and bowing that form different concave and convex regions along the slit structures and retrograded regions toward the top of the slit structures. Such irregular profiles present significant challenges to filling the air gaps or voids of the slit structures. Prior techniques for filling the slit structures using conformal fill materials tend to leave voids (e.g., form air gaps or air pockets) high up in the slit structures in areas where the slit structure profiles are retrograded at the top. Such voids are prone to propagate as cracks in subsequent processing due to external thermal or film stresses, resulting in in-line defects and yield loss.

Deposition of SOD fill material in slit structures can fill high aspect ratios (e.g., a height-to-width aspect ratio of a slit structure) without leaving air gaps or voids in the slit structures. However, SOD materials have the characteristic of shrinking during densification, resulting in large tensile stresses and localized die warpage (e.g., bow). This die warpage can cause misalignments of contacts and corresponding pillars, leading to high failure rates of IC die across a wafer.

Examples disclosed herein fill slit structures using a hybrid slit fill approach in which a chemical vapor deposition (CVD) high aspect ratio process (HARP) is used in combination with a spin-on-dielectric (SOD) process to fill slit structures with both HARP fill material and SOD fill material. For example, disclosed techniques control a CVD HARP process to apply a HARP material to a semiconductor substrate, in which the semiconductor substrate includes a slit structure between adjacent stacked transistor layers in a 3D stacked configuration. The HARP material coats walls of the slit structure to reduce a first width of the slit structure between the adjacent stacked transistor layers to a second, narrower width. Disclosed techniques then control a SOD process to apply a SOD material to the semiconductor substrate. The SOD material fills the second width of the slit structure such that the HARP material and the SOD material form a solid structure (e.g., a solid non-conductive structure, a solid electrically insulating structure) in the slit structure between the adjacent stacked transistor layers without leaving air gaps or voids in the slit structure. By combining HARP material with SOD material, global and/or local stresses across a wafer can be controlled, preventing this issue of die warpage.

Although examples disclosed herein are described as using HARP material and SOD material to fill slit structures, other types of fill material may alternatively or additionally be used. For example, a HARP material may be used in combination with a different material other than a SOD material, or a SOD material may be used in combination with a different material other than a HARP material. In some examples, a first material that is not a HARP material and not a SOD material may be used in combination with a second material that is not a HARP material and not a SOD material to fill slit structures in accordance with the teachings of this disclosure. In addition, although examples disclosed herein are described in connection with using two types of fill materials to fill slit structures, examples disclosed herein may be used to fill slit structures using more than two types of fill materials (e.g., using three or more types of fill materials).

In examples disclosed herein, numerous fill parameters are used to control HARP and SOD processes to substantially decrease or eliminate failure rates of semiconductor substrates that could otherwise result from poorly filled slit structures. Example fill parameters include a HARP material thickness parameter to control a thickness of the applied HARP film, a SOD densification temperature parameter to set a temperature used to densify the SOD film, and a SOD densification time parameter to control a duration of a densification phase to densify the SOD film. These are only some example fill parameters. Other fill parameters could additionally or alternatively be used in connection with the techniques disclosed herein. Example advantages of techniques disclosed herein include that multiple fill parameters can be used to control global and/or local stresses across a wafer such that the effect of incoming stress variations across different wafers or the effect of increased incoming positive stress can be neutralized, decreased, or otherwise changed to any desired level.

Examples disclosed herein may be used in connection with any type of IC semiconductor device including any semiconductor memory device. In some examples, the teachings of this disclosure may be used to substantially reduce or eliminate device defects and fallout that otherwise result from poorly filled slit structures. In this manner, examples disclosed herein can be used to increase yield in the manufacture of 3D NAND flash memory devices and/or any other memory device or IC semiconductor device (e.g., monolithic 3D stacked semiconductor substrates and/or other types of stacked semiconductor substrates).

Figure 1B:
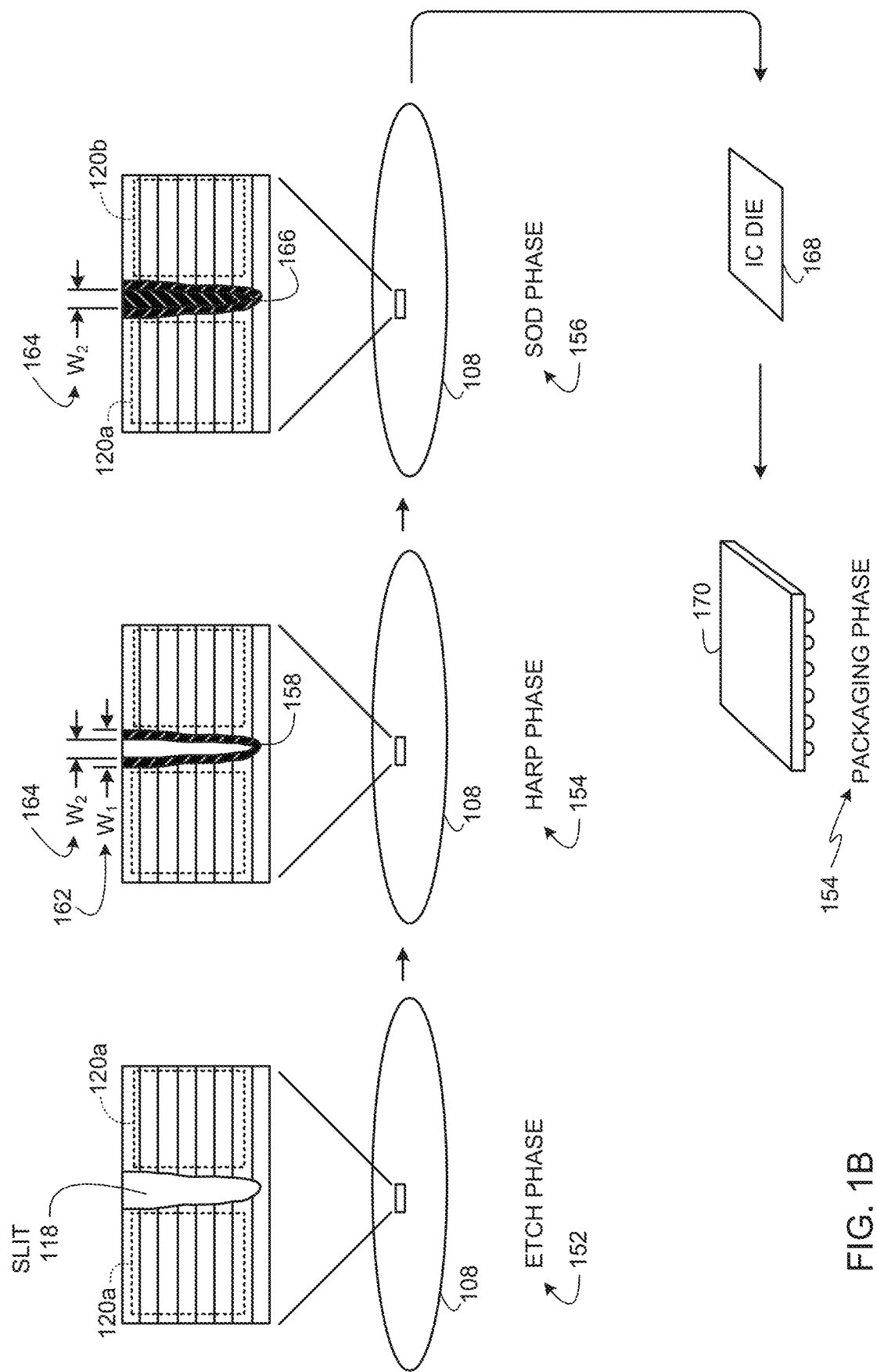
FIG. 1B depicts enlarged cross-sectional views of three dimensional (3D) stacked transistor layer structures in connection with the slit fill process of FIG. 1A.

FIG. 1A depicts an example fill parameter controller 102 and an example slit fill controller 104 implemented in accordance with the teachings of this disclosure to fill slit structures formed in semiconductor substrates on an example semiconductor wafer fabrication line 106. In the illustrated example, the semiconductor wafer fabrication line 106 fabricates a monolithic 3D stacked semiconductor substrate or wafer 108. A portion of the example semiconductor wafer fabrication line 106 is shown and includes an example etch station 110, an example HARP station 112, and an example SOD station 114. Other portions of the example semiconductor wafer fabrication line 106 are not shown. In the illustrated example, the monolithic 3D stacked semiconductor substrate or wafer 108 is received in the etch station 110 and is shown as it progresses through the HARP station 112 and the SOD station 114. Example enlarged views of the cross-sectional portions of the monolithic 3D stacked semiconductor substrate or wafer 108 are shown in FIG. 1B at an example etch phase 152 corresponding to the example etch station 110 of FIG. 1A, an example HARP phase 154 corresponding to the example HARP station 112 of FIG. 1A, and an example SOD phase 156 corresponding to the example SOD station 114 of FIG. 1A.

In the illustrated example of FIG. 1A, a portion of the semiconductor substrate 108 is shown in a magnified cross-sectional view in which numerous stacked transistor layers 116 are shown. In the illustrated example, the etch station 110 etches or forms a slit structure 118 from a top surface of the semiconductor substrate 108 down through the stacked transistor layers 116 between two adjacent stacked transistor layer structures 120a, 120b. In this manner, the etch station 110 is used to electrically isolate or separate the two adjacent stacked transistor layer structures 120a, 120b from one another using the slit structure 118. The stacked transistor layer structures 120a, 120b may form 3D NAND flash memory cells and/or any other types of 3D stacked memory cells or logic circuits. In the illustrated example, to keep the adjacent stacked transistor layer structures 120a, 120b electrically isolated from one another while filling the air gap or void created by the slit structure 118, the semiconductor substrate 108 is further processed at the HARP station 112 and the SOD station 114 to provide a hybrid HARP and SOD fill in the slit structure 118.

The example slit fill controller 104 includes an example HARP controller 124 and an example SOD controller 126. In the illustrated example, when the semiconductor substrate 108 is received at the HARP station 112 of FIG. 1A (e.g., the HARP phase 154 of FIG. 1B), the HARP controller 124 controls a CVD HARP process of the HARP station 112 to apply a HARP material or film 158 (FIG. 1B) to the semiconductor substrate 108. Example HARP materials include amorphous silicon dioxide ($SiO_2$) materials prepared based on reactions from Tetraethyl orthosilicate (TEOS) and ozone (O3). Other example amorphous silicon dioxide (SiO2) HARP materials include atomic layer deposition (ALD) oxide and XP8 material which is prepared by plasma-enhanced (PE) ALD (PEALD) deposition. Yet another example HARP material is Silanediamine, N,N,N', N'-tetraethyl ($C8H22N2Si$) (i.e., SAM.24) and oxygen. As shown in FIG. 1B, the HARP material 158 coats sidewalls of the slit structure 118 to reduce a first width ($W_1$) 162 of the slit structure 118 between the adjacent stacked transistor layers 120, 12b to a second, narrower width ($W_2$) 164.

In the illustrated example, when the semiconductor substrate 108 is received at the SOD station 114 of FIG. 1A (e.g., the SOD phase 156 of FIG. 1B), the SOD dielectric controller 126 controls a SOD process of the SOD station 114 to apply a SOD material or film 166 to the semiconductor substrate 108. Example SOD materials include Poly-based inorganic spin-on dielectric materials (e.g., per-hydro Polysilazane—SiH2NH) such as AZ Spinfil® Series SOD materials manufactured by EMD Performance Materials Corp. For example, AZ Spinfil® Series materials SF710, SF720, and SF730 have various viscosities and suggested coating thicknesses between 100 nanometers (nm) and 400 nm that may be used as SOD material to implement examples disclosed herein. As shown in FIG. 1B, the SOD material 166 coats sidewalls created by the HARP material 158 to fill the second width $W_2$ 164 of the slit structure 118 such that the HARP material 158 and the SOD material 166 form a solid structure (e.g., a solid non-conductive structure) in the slit structure 118 between the adjacent stacked transistor layers 120a and 120b. In this manner, the slit structure 118 is devoid or substantially devoid of any air gaps or voids that could result in defects or failures in the semiconductor substrate.

Although the example wafer fabrication line 106 is shown as including the HARP station 112 before the SOD station 114, in other examples, the ordering of the HARP station 112 and the SOD station 114 may be reversed. In such other examples, the SOD station 114 receives the semiconductor substrate 108 from the etch station 110 to apply a SOD material in the slit structure 118 before conveying the semiconductor substrate 108 to the HARP station 112 to apply a HARP material to the slit structure 118. As such, although examples disclosed herein are described as a HARP material applied first to slit structures followed by a subsequent application of a SOD material, such ordering of the materials can be reversed so that slit structures are first coated with a SOD material followed by application of a HARP material.

Although the example slit fill controller 104 includes the example HARP controller 124 and the example SOD controller 126, in other examples, the example slit fill controller 104 could additionally or alternatively include other types of fill material controllers corresponding to types of materials (e.g., other than or in addition to HARP and/or SOD materials) used to fill slit structures in accordance with examples disclosed herein. In some examples, the slit fill controller 104 could be configured to include more than two controllers for instances in which more than two types of fill materials are used to fill slit structures in accordance with examples disclosed herein. In such examples, the numerous controllers could include the HARP controller 124 and the SOD controller 126 in combination with any one or more other type(s) of fill material controller. Alternatively, the numerous controllers could omit one or both of the HARP controller 124 and/or the SOD controller 126, and could include any combination of any other types of fill material controllers. In the illustrated example, the HARP controller 124 and the SOD controller 126 (and/or any other fill material controller(s) of the example slit fill controller 104) could be implemented using a single processor (e.g., the processor 1412 of FIG. 14) or using separate respective processors.

In examples disclosed herein, the slit fill controller 104 is in communication with an example fill parameter store 130 to access numerous fill parameters FP1 132a, FP2 132b, FP3 132c, etc. for use in controlling the HARP process at the HARP station 112 during the HARP phase 154, and controlling the SOD process at the SOD station 114 during the SOD phase 156. Example fill parameters include a HARP material thickness parameter to control a thickness of the applied HARP material, a SOD densification temperature parameter to set a temperature used to densify the SOD material, and a SOD densification time parameter to control a duration of a densification phase to densify the SOD material. These are only some example fill parameters. Other fill parameters could additionally or alternatively be used in connection with the techniques disclosed herein.

Examples disclosed herein select values for the fill parameters 132a-c based on desired global and/or local stresses observed in a wafer such as the semiconductor substrate 108. A global stress of a wafer is tensile or compressive force across an entire wafer that leads to warpage or bow. A local stress is tensile or compressive force observed at a portion of the wafer that does not affect other portions of the wafer. Such global and local stresses of a wafer result from relaxation or tightening of the wafer or portions of the wafer during fabrication process steps due to chemical reactions and physical changes (e.g., etching and depositing materials). Such changes in global and/or local stresses can build up in undesired ways following one or more etching and/or material deposition steps and can lead to increased failure rates per wafer.

In examples disclosed herein, target or threshold global and/or local stresses are used to set values for the fill parameters 132a-c. Global and/or local stresses of wafers can be measured using a number of techniques including using, for example, optical surface profilometers and/or multiwavelength Raman spectroscopy. As such, examples disclosed herein use global and/or local stress observation techniques during laboratory phases and/or fabrication set-up phases to set values for the fill parameters 132a-c that correspond to measured global and/or local stresses that satisfy target or threshold global and/or local stress values.

In the illustrated example of FIG. 1A, the fill parameter controller 102 is employed during a laboratory phase and/or a fabrication set-up phase to set values for the fill parameters 132a-c to be used by the HARP controller 124 to control the HARP station 112, and used by the SOD controller 126 to control the SOD station 114 to fill slit structures (e.g., such as the slit structure 118) during a production phase of wafers (e.g., such as the semiconductor substrate 108). In the illustrated example, a laboratory phase is a time during which global and/or local stresses of a wafer (e.g., such as the semiconductor substrate 108) are observed after using numerous different values for the fill parameters 132a-c, and selecting the values for the fill parameters 132a-c that result in global and/or local stresses which satisfy corresponding target or threshold global and/or local stress values. In some examples, the laboratory environment is located at a different site separate from a wafer fabrication line that is to fabricate production run wafers. In such examples, the fill parameter controller 102, the slit fill controller 104, and the wafer fabrication line 106 are operated in the laboratory environment to determine suitable values for the fill parameters 132a-c, and the selected values are transmitted or sent to the site at which the production wafer fabrication line (e.g., similar to the production wafer fabrication line 106) is located.

In the illustrated example, a fabrication set-up phase is a time during which the wafer fabrication line 106 is set up to fabricate a particular IC design on wafers. Such setting up may entail configuring different parameters into stations (e.g., the etch station 110, the HARP station 112, and the SOD station 114 of FIG. 1A) of the wafer fabrication line 106. For example, stations may be configured with material deposition volume parameters, material densification times, material densification temperatures, etc. When a different IC design is to be fabricated by the wafer fabrication line 106, another fabrication set-up phase may be employed to set up the different stations of the wafer fabrication line 106 for that particular IC design.

The fill parameter controller 102 of the illustrated example can be used to select different values for the fill parameters 132a-c for use across different production runs for different IC designs. For example, a production run of one IC design may use fill parameter values that are different from fill parameters for a different IC design production run. The fill parameter values 132a-c may be different due to different global and/or local stress requirements across a wafer for the different IC designs. For example, values may be selected for the fill parameters 132a-c to modulate at least one of global stress across the semiconductor substrate 108 or local stress surrounding the slit structure 118 between the adjacent stacked transistor layer structures 120a, 120b. In this manner, the example fill parameter controller 102 can be configured to select different values for the fill parameters 132a-c suitably customized for each IC design production run to substantially decrease or eliminate failure rates of semiconductor substrates that could otherwise result from poorly filled slit structures. Values for the fill parameters 132a-c may additionally or alternatively be selected to achieve particular wafer fabrication throughput during a production process. In some examples, selection of values for the fill parameters 132a-c is based on balancing acceptable failure rates of semiconductor substrates with acceptable wafer fabrication throughput.

In the illustrated example of FIG. 1A, fill parameter controller 102 includes an example stress monitor 136 and an example fill parameter value generator 138. The example stress monitor 136 may be implemented using any suitable device or technique (e.g., optical surface profilometers and/or multiwavelength Raman spectroscopy) for measuring global and/or local stresses of wafers. The example stress monitor 136 is provided to measure global and/or local stresses of wafers (e.g., the semiconductor substrate 108) during HARP and SOD processes. For example, each time the HARP station 112 applies a HARP material to the semiconductor substrate 108, the stress monitor 136 measures global and/or local stresses of the semiconductor substrate 108. In addition, each time the SOD station 114 applies an SOD material to the semiconductor substrate 108, the stress monitor 136 measures global and/or local stresses of the semiconductor substrate 108. Multiple measurements corresponding to each of the HARP and SOD processes can be obtained over multiple iterations during which different fill parameter values are used at the HARP station 112 and the SOD station 114. As the different fill parameter values are used at the HARP station 112 and the SOD station 114, the global and/or local stress measurements collected by the stress monitor 136 change such that some fill parameter values result in global and/or local stresses that satisfy target or threshold global and/or local stresses, while other fill parameter values result in global and/or local stresses that do not satisfy target or threshold global and/or local stresses.

The example fill parameter value generator 138 and/or the stress monitor 136 compare the global and/or local stress measurements generated by the stress monitor 136 for the HARP process and the SOD process to target or threshold global and/or local stress values. When the fill parameter value generator 138 and/or the stress monitor 136 detects a match between global and/or local stress measurement(s) and target or threshold global and/or local stress measurement(s) corresponding to the HARP process, the fill parameter value generator 138 obtains one or more fill parameter value(s) corresponding to the matching global and/or local stress measurement(s) to select for storing as one or more corresponding one(s) of the fill parameters values 132a-c for the HARP process. Similarly, when the fill parameter value generator 138 and/or the stress monitor 136 finds a match between global and/or local stress measurement(s) and target or threshold global and/or local stress measurement(s) corresponding to the SOD process, the fill parameter value generator 138 obtains one or more fill parameter value(s) corresponding to the matching global and/or local stress measurement(s) to select for storing as one or more corresponding one(s) of the fill parameter values 132a-c for the SOD process. In the illustrated example, the example stress monitor 136 and the example fill parameter generator 138 could be implemented using a single processor (e.g., the processor 1412 of FIG. 14) or using separate respective processors.

In the illustrated example, the fill parameter value generator 138 stores the selected fill parameter values 132a-c in the fill parameter store 130. The fill parameter store 130 may be implemented using any type of data structure (e.g., a database, a table, etc.) and stored in any suitable type of memory. The fill parameter store 130 is configured to store the fill parameters 132a-c for use by the slit fill controller 104 during a production phase.

During a laboratory phase or a set-up phase to determine values for use with the fill parameters 132a-c, the example fill parameter controller 102 is used in combination with the example slit fill controller 104, the example wafer fabrication line 106, and the example fil parameter store 130. During a production phase, the fill parameter controller 102 can be omitted. As such, during the production phase, the example slit fill controller 104 is used in combination with the fill parameter values stored in the example fill parameter store 130 and in combination with the example wafer fabrication line 106 to control the example HARP station 112 and the example SOD station 114 to fill slit structures (e.g., such as the slit structure 118) of production wafers (e.g., such as the semiconductor substrate 108).

In some examples, a fill parameter 132a-c corresponding to the HARP process is a HARP material thickness parameter used to control a thickness of a HARP material or film by controlling a quantity or volume of HARP material deposited by the HARP station 112. For example, increasing thickness of a HARP material increases the compressibility of the semiconductor substrate 108, resulting in lower global and local stresses. A thicker layering of the HARP material may be selected to increase compressive stress of the semiconductor substrate 108, which results in more favorable global and local stresses, reducing the tendency for crack propagation.

Turning briefly to FIG. 2, an example HARP material thickness parameter table 200 includes HARP material thickness values for controlling quantities or volumes of the HARP material 158 (FIG. 1B) deposited by the HARP station 112 of FIG. 1A. In the illustrated example, HARP material thickness values are provided for three different generations of monolithic 3D stacked semiconductor substrates having different quantities of stories (e.g., stacked layers), in which each story is about 0.055 micrometers or microns (um). For example, a HARP material thickness of about 600 angstroms (Å) is used for a 37-story first ($1^{st}$) generation monolithic 3D stacked semiconductor substrate of about two um high. An example HARP material thickness of about 1050 angstroms (Å) is used for a 74-story second ($2^{nd}$) generation monolithic 3D stacked semiconductor substrate of about 4 um high. An example HARP material thickness of about 1600 angstroms (Å) is used for a 106-story third ($3^{rd}$) generation monolithic 3D stacked semiconductor substrate of about 6 um high. The HARP material thickness parameter values shown in the example HARP material thickness parameter table 200 are example values. In other examples, other HARP material thickness values may be used based on manufacturer preference, IC design, failure rate performance preference, fabrication environment variables, or based on any other reason.

In the illustrated examples, in addition to desired target or threshold global and/or local stresses, another example criterion used to select HARP material thickness is prevention of the HARP material or film from forming a pinch-off structure in the slit structure 118. For example, formations of pinch-off structures can be detected by monitoring for unchanging global and/or local stresses when further HARP material is deposited in the HARP deposition phase during the laboratory or fabrication set-up phase. Pinch-off structures and their adverse effects are discussed in detail below in connection with FIGS. 5 and 6. Yet another example criterion used to select HARP material thickness is ensuring sufficient aspect ratio (e.g., a height-to-width ratio of the slit structure) in the remaining slit width after applying the HARP material so that the subsequently applied SOD material can flow through the remaining slit width to fill it without leaving air gaps or voids. Aspect ratios that are sufficient to allow a solid SOD material fill without creating air gaps or voids depends on a number of factors including viscosity of the SOD material and the pattern fill of slit structures (e.g., degree of retrograding of slit structure sidewalls across a wafer).

Although only one HARP fill parameter is shown, other HARP fill parameters may additionally or alternatively be used. For example, HARP deposition temperature may be another HARP fill parameter. In examples disclosed herein, HARP deposition temperature is set at 540° C. for the three different generations of monolithic 3D stacked semiconductor substrates. However, the HARP deposition temperature may be varied to achieve different desired global and/or local stresses. Additionally or alternatively, HARP deposition temperature may be selected to achieve acceptable wafer fabrication throughput during a production process.

Returning to FIG. 1A, in some examples, a fill parameter 132a-c corresponding to the SOD process is a SOD densification temperature parameter that is used by the SOD controller 126 to set a temperature used by the SOD station 114 to densify a SOD material or film on the semiconductor substrate 108. For example, a lower densification temperature may be selected to increase the tensile stress of the semiconductor substrate 108, resulting in more favorable global and local stresses that facilitate wafer chucking (e.g., a technique to hold a wafer during processing along the wafer fabrication line 106) in downstream processes. A higher densification temperature may be selected to increase the compressive stress of the semiconductor substrate 108, which results in more favorable global and local stresses against crack propagation.

Turning briefly to FIG. 3, an example SOD densification temperature parameter table 300 includes temperature values for controlling temperatures applied by the SOD station 114 of FIG. 1A during a densification process of the applied SOD material 166 (FIG. 1B). In the illustrated example, SOD densification temperature values are provided for three different generations of monolithic 3D stacked semiconductor substrates having different quantities of stories (e.g., stacked layers), in which each story is about 0.055 micrometers or microns (um). For example, a SOD densification temperature value of about 500+/−25° C. is used for a 37-story first ($1^{st}$) generation monolithic 3D stacked semiconductor substrate of about two um high. An example SOD densification temperature value of about 550+/−25° C. is used for a 74-story second ($2^{nd}$) generation monolithic 3D stacked semiconductor substrate of about 4 um high, and is used for a 106-story third ($3^{rd}$) generation monolithic 3D stacked semiconductor substrate of about 6 um high. The SOD densification temperature values shown in the example SOD densification temperature parameter table 200 are example values. In other examples, other SOD densification temperature values may be used based on manufacturer preference, IC design, failure rate performance preference, fabrication environment variables, or based on any other reason.

Returning to FIG. 1A, in some examples, a fill parameter 132a-c corresponding to the SOD process is a SOD densification time parameter used by the SOD controller 126 to control a duration of a densification phase to densify the SOD material or film on the semiconductor substrate 108. For example, a shorter densification time may be selected to increase the tensile stress of the semiconductor substrate 108, resulting in more favorable global and local stresses that facilitate wafer chucking (e.g., a technique to hold a wafer during processing along the wafer fabrication line 106) in downstream processes. A longer densification time may be selected to increase the compressive stress of the semiconductor substrate 108, which results in more favorable global and local stresses against crack propagation.

Turning briefly to FIG. 4, an example SOD densification time parameter table 400 includes SOD densification time values for controlling durations of a densification process of the SOD material 166 (FIG. 1B) applied by the SOD station 114 of FIG. 1A. In the illustrated example, SOD densification time values are provided for three different generations of monolithic 3D stacked semiconductor substrates having different quantities of stories (e.g., stacked layers), in which each story is about 0.055 micrometers or microns (um). For example, a SOD densification time value of about 4-6 hours is used for a 37-story first ($1^{st}$) generation monolithic 3D stacked semiconductor substrate of about two um high, and is used for a 74-story second ($2^{nd}$) generation monolithic 3D stacked semiconductor substrate of about 4 um high. An example SOD densification time value of about 6-8 hours is used for a 106-story third ($3^{rd}$) generation monolithic 3D stacked semiconductor substrate of about 6 um high. The SOD densification time parameter values shown in the example SOD densification time parameter table 400 are example values. In other examples, other SOD densification time values may be used based on manufacturer preference, IC design, failure rate performance preference, fabrication environment variables, or based on any other reason.

In the illustrated example of FIG. 1B, the two adjacent stacked transistor layer structures 120a, 120b and the interposing filled slit structure 118 are shown packaged into an example IC chip package 170 during an example packaging phase 172. For example, the two adjacent stacked transistor layer structures 120a, 120b and the interposing filled slit structure 118 can be part of an IC die 168 cut from the semiconductor substrate 108 to manufacture an electrical device (e.g., a memory device, a processor, a logic circuit, etc.) in the IC chip package 170. As such, the IC chip package 170 includes the IC die 168, which includes the adjacent stacked transistor layer structures 120a, 120b, the slit structure 118 interposing the adjacent stacked transistor layer structures 120a, 120b, the HARP material applied to the sidewalls of the slit structure 118 that define the first width ($W_1$) 162 of the slit structure 118, and the SOD material 166 applied to sidewalls created by the HARP material in the slit structure 118 that define the narrower, second width ($W_2$) 164. Although only two adjacent stacked transistor layer structures 120a, 120b and one interposing filled slit structure 118 are shown in FIG. 1B, the IC die 168 packaged into the IC chip package 170 can include any number of stacked transistor layer structures and interposing filled slit structures.

Figure 5:
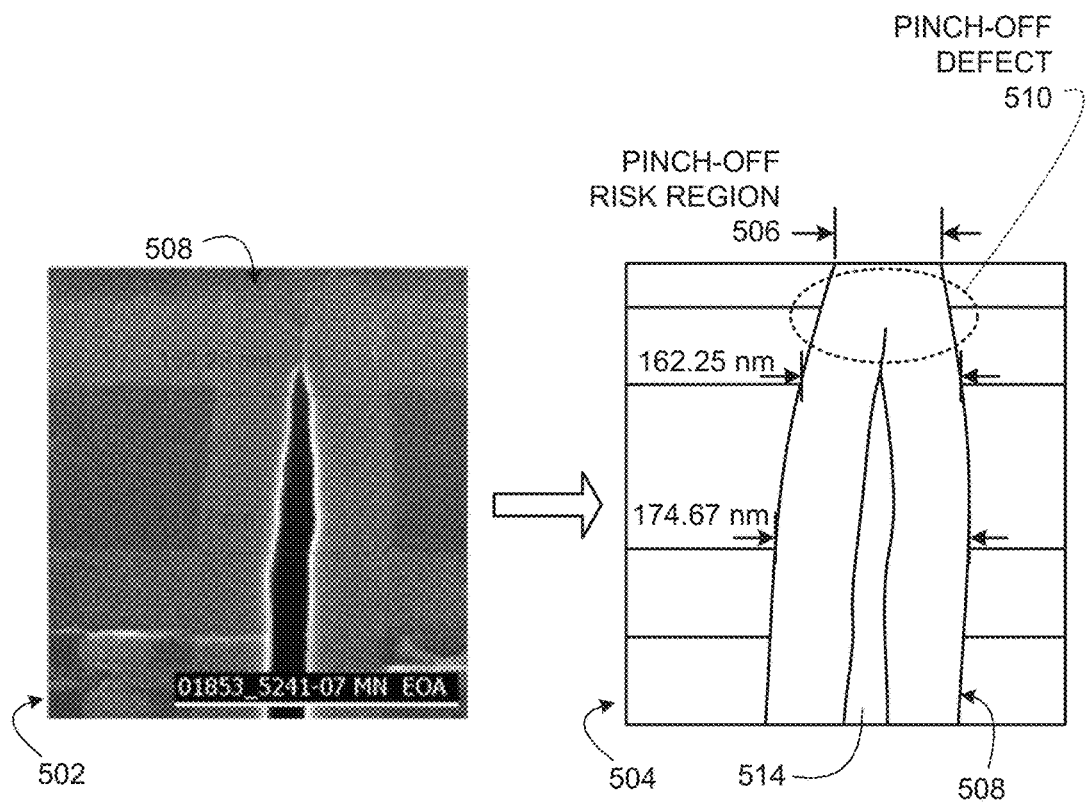
FIG. 5 depicts an example retrograde profile at a top portion of a slit structure resulting in a pinch-off defect creating a void in the slit structure in a poorly controlled HARP deposition process.

FIG. 5 depicts a scanning electron microscope (SEM) image 502 and a corresponding line drawing 504 of an example retrograde profile creating a pinch-off risk region 506 at a top portion of a slit structure 508 resulting in a pinch-off defect 510 creating an air gap or void 514 in the slit structure 508. The retrograde profile of the slit structure 508 creates a narrowing of the slit structure 508 toward the top. For example, the slit structure 508 has a wider width of 174.67 nanometers (nm) towards a bottom portion, but its retrograde profile creates a narrower width of 162.25 nm towards the top. The greater the retrograde of a slit structure profile, the worse the fill capability (e.g., a greater likelihood of creating sealed-off air gaps or voids 514) when using prior techniques that deposit a single conformal fill material (e.g., only a HARP material) for filling slit structures.

The air gap or void 514 can be avoided by properly controlling a HARP deposition process using examples disclosed herein. For example, if a HARP material thickness parameter of the fill parameters 132a-c (FIG. 1A) is assigned a value that is too large, when the HARP material is deposited on the walls of the slit structure 508, the large HARP material thickness at the pinch-off risk region 506 will cause the HARP material built up from the sidewalls to meet, creating the pinch-off defect 510 of FIG. 5. When the HARP material creates the pinch-off defect 510 at the top portion of the slit structure 508, as shown in FIG. 5, the air gap or void 514 is sealed off from further fill material (e.g., a SOD material when using examples disclosed herein). As such, the air gap or void 514 becomes fixed in the slit structure 508, preventing further stress modulation of the semiconductor substrate 108 that could otherwise be achieved by further filling the air gap or void 514. Using examples disclosed herein, a HARP material thickness parameter of the fill parameters 132a-c (FIG. 1A) is assigned a value that achieves sufficient HARP material thickness on the sidewalls of the slit structure 508 without creating the pinch-off defect 510.

Figure 6:
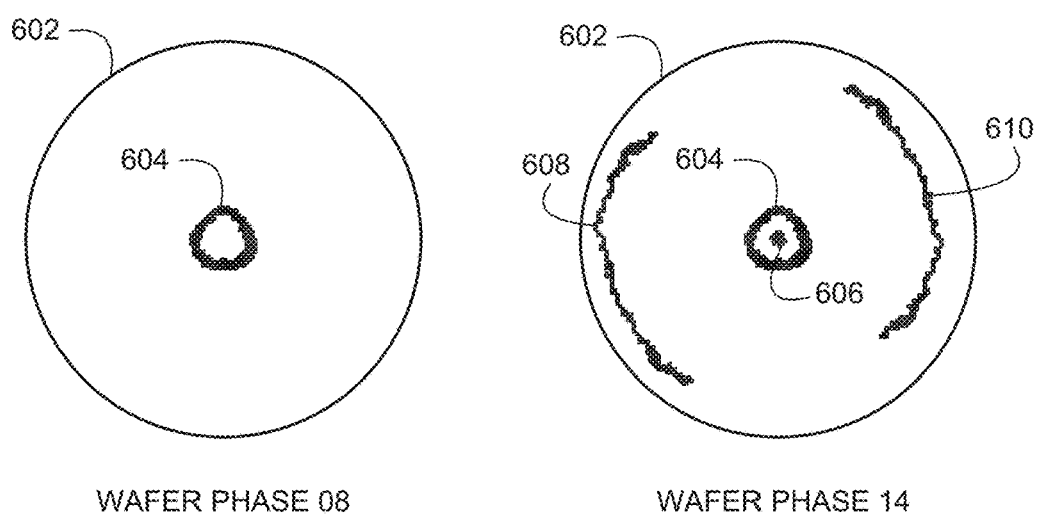
FIG. 6 is an example semiconductor substrate at two different phases of a prior wafer fabrication line in which voids such as the void of FIG. 2 propagate during a back end of line (BEOL) processing, resulting in bitline-to-bitline (BL-BL) shorts.

When voids, such as the air gap or void 514 of FIG. 5, are created in slit structures, failure rates per wafer increase for a number of reasons. For example, global and/or local stresses can no longer be changed or modulated in a semiconductor substrate when air gaps or voids are sealed off from further fill material. As the wafers with air gaps or voids propagate through a wafer fabrication line, failure rates increase toward back-end-of-line (BEOL) processing. In memory circuits, such BEOL failures are sometimes due to bitline-to-bitline (BL-BL) shorts caused by air gaps or voids. For example, air gaps or voids in slit structures may become backfilled with conductive material (e.g., metal such as Tungsten) during a subsequent metallization process. Example increased failure rates are shown in FIG. 6 in which line drawings depict failure regions of an example semiconductor substrate 602 at two different phases of a prior wafer fabrication line. For example, during a wafer phase 08, a single annular failure region 604 appears near the center of the semiconductor substrate 602. The semiconductor substrate 602 is then shown at a wafer phase 14 after voids, such as the air gap or void 514 of FIG. 5, are created and the semiconductor substrate 602 progresses through the wafer fabrication line. As shown, an additional failure region 606 appears near the center of the semiconductor substrate 602, and additional failure regions 608, 610 appear near the edge of the semiconductor substrate 602 at the wafer phase 14.

Figure 7:
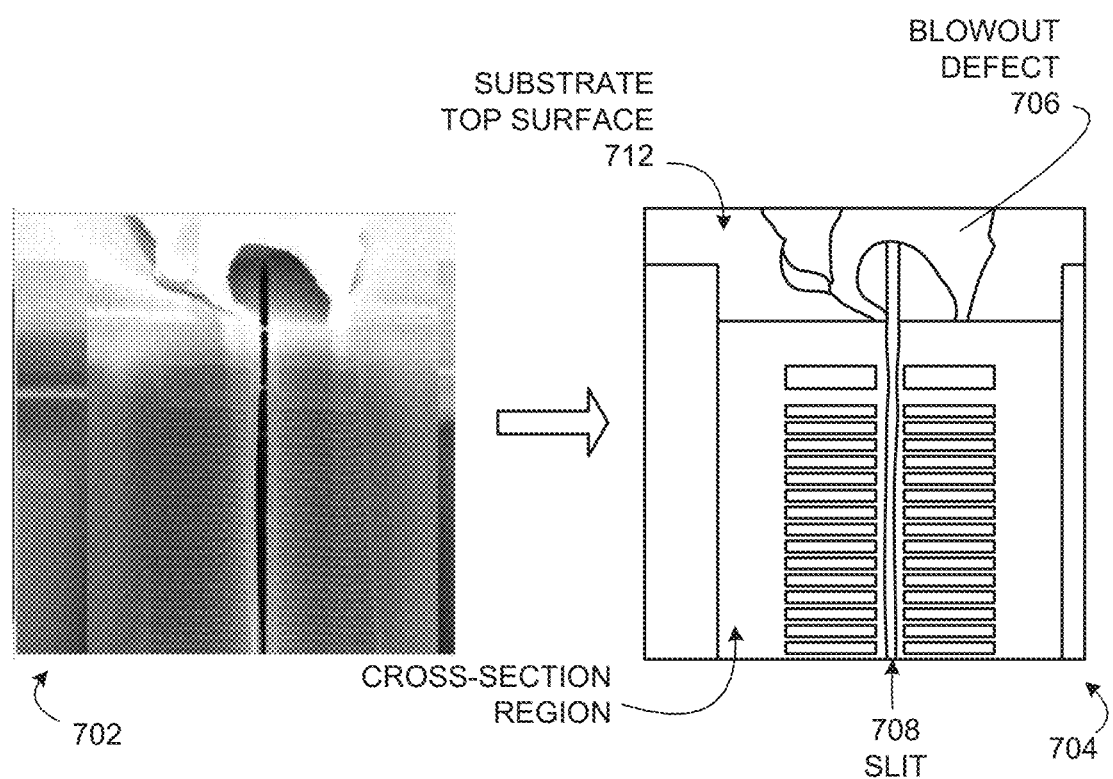
FIG. 7 is a cross-sectional perspective view of a blowout defect resulting from prior slit fill techniques.

FIG. 7 depicts a SEM image 702 and a corresponding line drawing 704 of a cross-sectional perspective view of a blowout defect 706 resulting from a prior slit fill technique that left a void (e.g., the air gap or void 514 of FIG. 5) in a slit structure 708. In the illustrated example, as high temperatures were applied to a semiconductor substrate corresponding to FIG. 7 during subsequent fabrication operations, air expanded in the pinched-off slit structure 708. To escape, the expanded air blew out a pinch-off defect (e.g., the pinch-off defect 510 of FIG. 5) in the slit structure 708 toward a substrate top surface 712, resulting in the blowout defect 706. Such blowout defects increase as high temperatures are applied to semiconductor substrates, resulting in higher failure rates during BEOL operations of a wafer fabrication line as shown in FIG. 6.

Figure 8A:
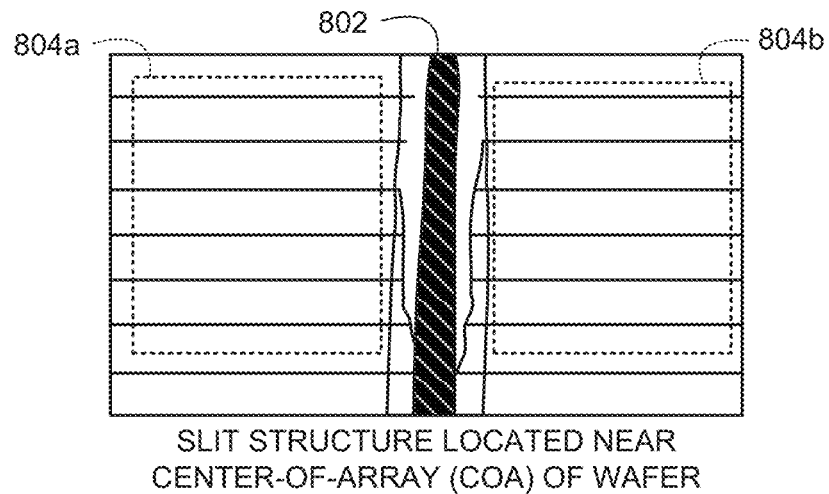
FIGS. 8A and 8B depict slit structures having different retrograde profiles at different regions of a semiconductor substrate.
Figure 8B:
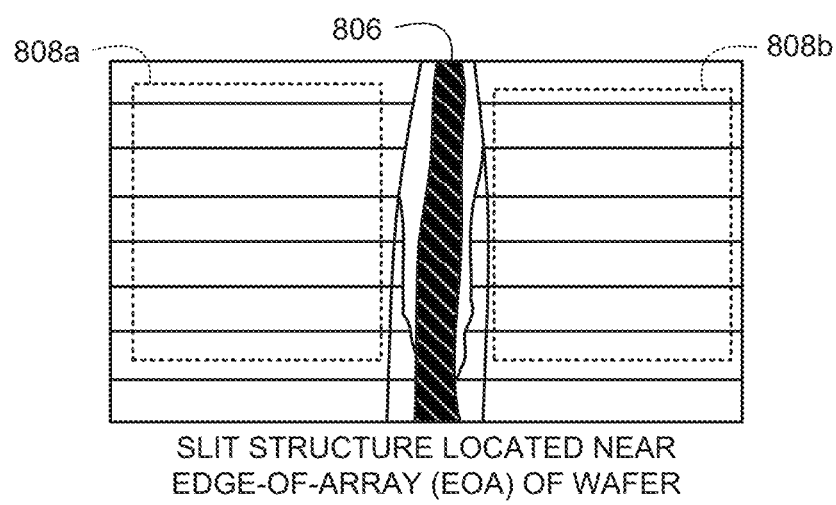

Using examples disclosed herein to perform a hybrid slit fill process in which HARP material and SOD material are used to fill slit structures, wafer failure rates can be substantially reduced. For example, FIG. 8A depicts a COA slit structure 802 located between layers of stacked transistors 804a, 804b of the semiconductor substrate 108 of FIGS. 1A and 1B, and FIG. 8B depicts an EOA slit structure 806 located between layers of stacked transistors 808a, 808b of the semiconductor substrate 108. In the illustrated examples, the COA slit structure 802 and the EOA slit structure 806 have different profiles that are successfully filled using examples disclosed herein. For example, the COA slit structure 802 is located near the center (e.g., center-of-array (COA)) of a semiconductor array of the semiconductor substrate 108 and has very little or no retrograding in its profile. However, the EOA slit structure 806, located near the edge (e.g., edge-of-array (EOA)) of the semiconductor array of the semiconductor substrate 108, has a significant amount of retrograding in its profile toward a top surface of the semiconductor substrate 108. In examples disclosed herein, values for the fill parameters 132a-132c are selected so that slit structures of all regions of a semiconductor substrate and having different degrees of retrograding in their profiles can be successfully filled without creating pinch-off defects (e.g., the pinch-off defect 510 of FIG. 5) and sealed air gaps or voids (e.g., the air gap or void 514 of FIG. 5).

Figure 9:
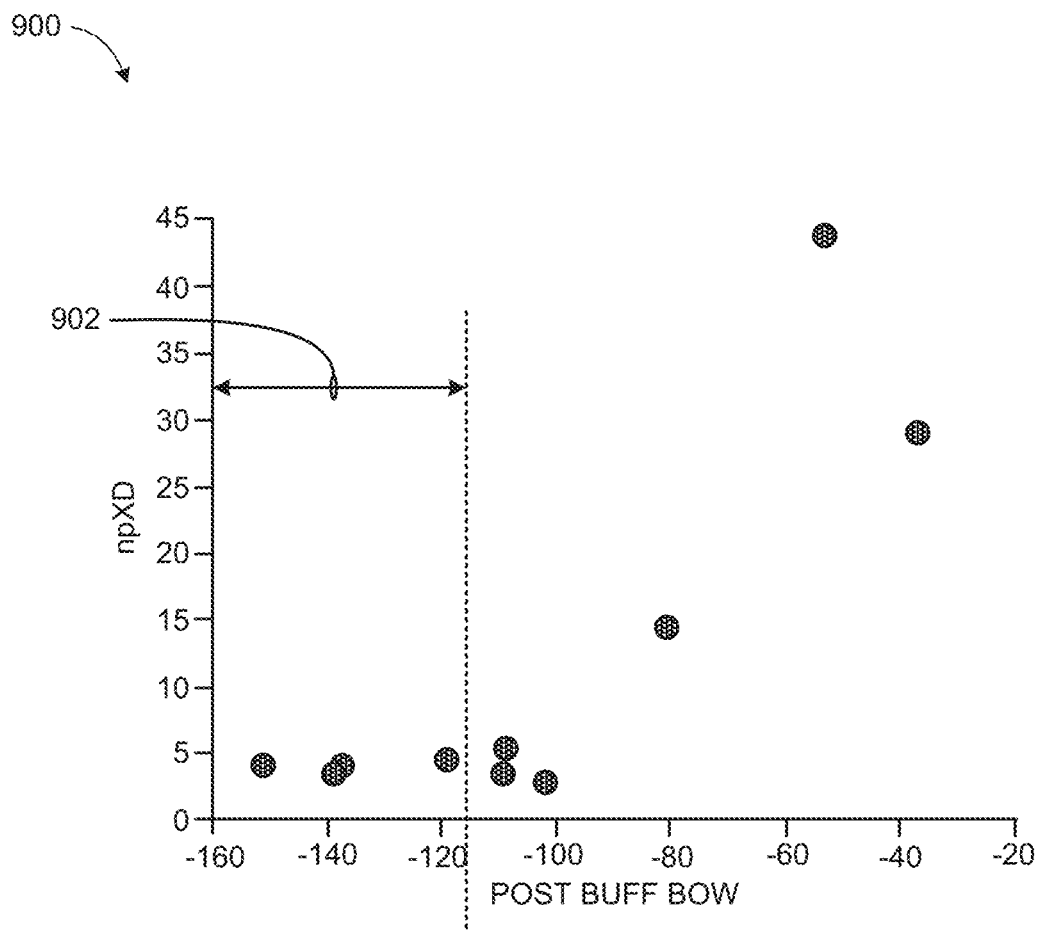
FIG. 9 is an example bivariate fit graph of percentages of failures to bin XD by post-buff bow.

FIG. 9 is an example bivariate fit graph 900 of percentages of failures to bin XD by post-buff bow. In the illustrated example, bin XD is a failing bin in electrical testing from a wafer such as the semiconductor substrate 108 of FIGS. 1 and 2 from which a quantity of IC dies will be produced. A bin is a bucket or grouping of IC dies (e.g., a subset of IC dies cut from one or more wafers) meeting particular electrical testing requirements. A failing bin is a grouping of IC dies that have failed electrical testing requirements. The measure of bow is used as a proxy for wafer stress. Higher stress leads to more bow. Positive stress increases crack propagation because it is more tensile, while negative stress decreases crack propagation because it is more compressive. Post-buff bow refers to a stress measurement after a wafer (e.g., the semiconductor substrate 108) has been through a buff chemical mechanical planarization (CMP) process. This is a location in the process flow of a wafer fabrication line, soon after slit structures are filled. Since actual wafer bow measured on different lots depends on the incoming bow, measurements of bow change can be normalized with respect to the incoming bow for more accurate comparisons across numerous wafers.

In the illustrated example of FIG. 9, percentage of fails for bin XD is the quantity of failures at bin XD per the quantity of IC die incoming to bin XD. The graph 900 shows an identified stress buffer 902 in which global and/or local stress can be modulated to be more negative so that there is more room to move away from the bin XD cliff to protect against incoming stress variations (e.g., from any process changes at prior levels). The example bivariate fit graph 900 represents bin XD failures that occur due to contacts misaligned over pillars. Such contact-to-pillar misalignment causes undesired current leakage during operation of the IC either because pillars are not in contact with voltage potentials at corresponding contacts or because pillars become aligned with incorrect contacts. Other types of bin XD failures can also occur from bitline-to-bitline shorts when slit voids (e.g., the air gap or void 514 of FIG. 5) propagate up as cracks. However, when the example fill techniques disclosed herein are used, contacts misaligned over pillars and bitline-to-bitline shorts are substantially reduced or eliminated because sealed off air gaps or voids are not created in semiconductor substrates.

Figure 10:
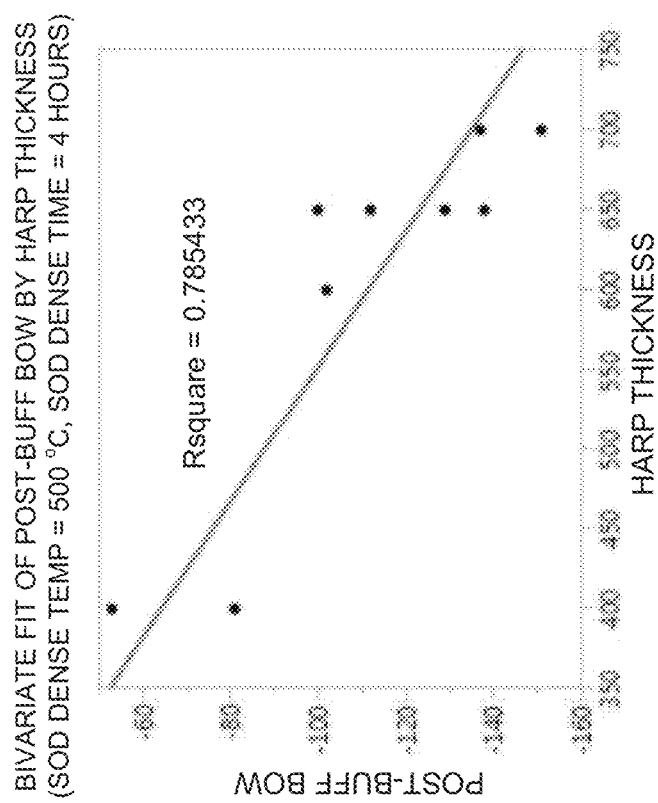
FIG. 10 is an example bivariate fit graph of measures of post-buff bow by varying HARP material thickness.
Figure 11:
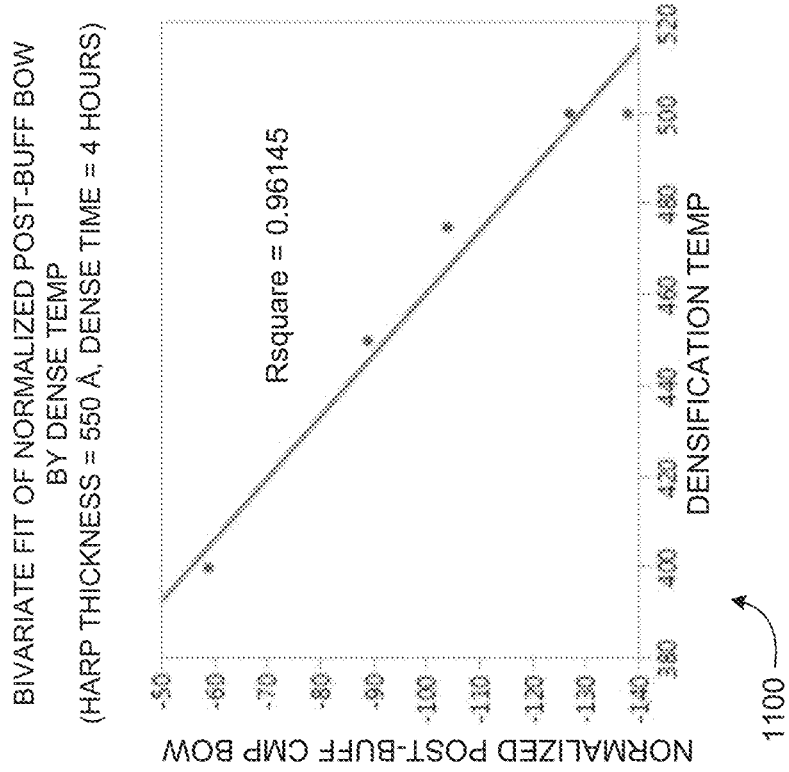
FIG. 11 is an example bivariate fit graph of measures of post-buff bow by varying SOD densification temperature.

FIG. 10 is an example bivariate fit graph 1000 of measures of post-buff bow by varying HARP material thickness. In the illustrated example, the SOD densification temperature is set at 500° C. and the SOD densification time is set at four hours, while the HARP material thickness is changed across different wafers from 400 angstroms (Å) to 700 angstroms (Å). FIG. 11 is an example bivariate fit graph 1100 of measures of post-buff bow by varying SOD densification temperature. In the illustrated example of FIG. 11, HARP material thickness is set at 550 angstroms (Å) and SOD densification time is set at four hours, while the SOD densification temperature is changed across different wafers from 400° C. to 500° C. In the examples of FIGS. 10 and 11, the corresponding linear fits of bow measurement data points show how bow (e.g., stress) changes across wafers as corresponding fill parameter values change. The linear fits of FIGS. 10 and 11 are shown with corresponding RSquare values which indicate the goodness of the linear fit. The closer the RSquare value is to 1.0, the closer the linear fit.

While an example manner of implementing the example fill parameter controller 102, the example slit fill controller 104, and the example fill parameter store 130 is illustrated in FIG. 1A, one or more of the elements, processes and/or devices illustrated in FIG. 1A may be combined, divided, re-arranged, omitted, eliminated and/or implemented in any other way. Further, the example fill parameter controller 102, the example stress monitor 136, the example fill parameter value generator 138, the example slit fill controller 104, the example HARP controller 124, the example SOD controller 126, and/or the example fill parameter store 130 of FIG. 1A may be implemented by hardware, software, firmware and/or any combination of hardware, software and/or firmware. Thus, for example, any of the example fill parameter controller 102, the example stress monitor 136, the example fill parameter value generator 138, the example slit fill controller 104, the example HARP controller 124, the example SOD controller 126, and/or the example fill parameter store 130 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example fill parameter controller 102, the example stress monitor 136, the example fill parameter value generator 138, the example slit fill controller 104, the example HARP controller 124, the example SOD controller 126, and/or the example fill parameter store 130 is/are hereby expressly defined to include a tangible computer readable storage device or storage disk such as a memory, a digital versatile disk (DVD), a compact disk (CD), a Blu-ray disk, etc. storing the software and/or firmware. Further still, the example the example fill parameter controller 102, the example stress monitor 136, the example fill parameter value generator 138, the example slit fill controller 104, the example HARP controller 124, the example SOD controller 126, and/or the example fill parameter store 130 of FIG. 1A may include one or more elements, processes and/or devices in addition to, or instead of, those illustrated in FIG. 1A, and/or may include more than one of any or all of the illustrated elements, processes and devices.

Figure 12:
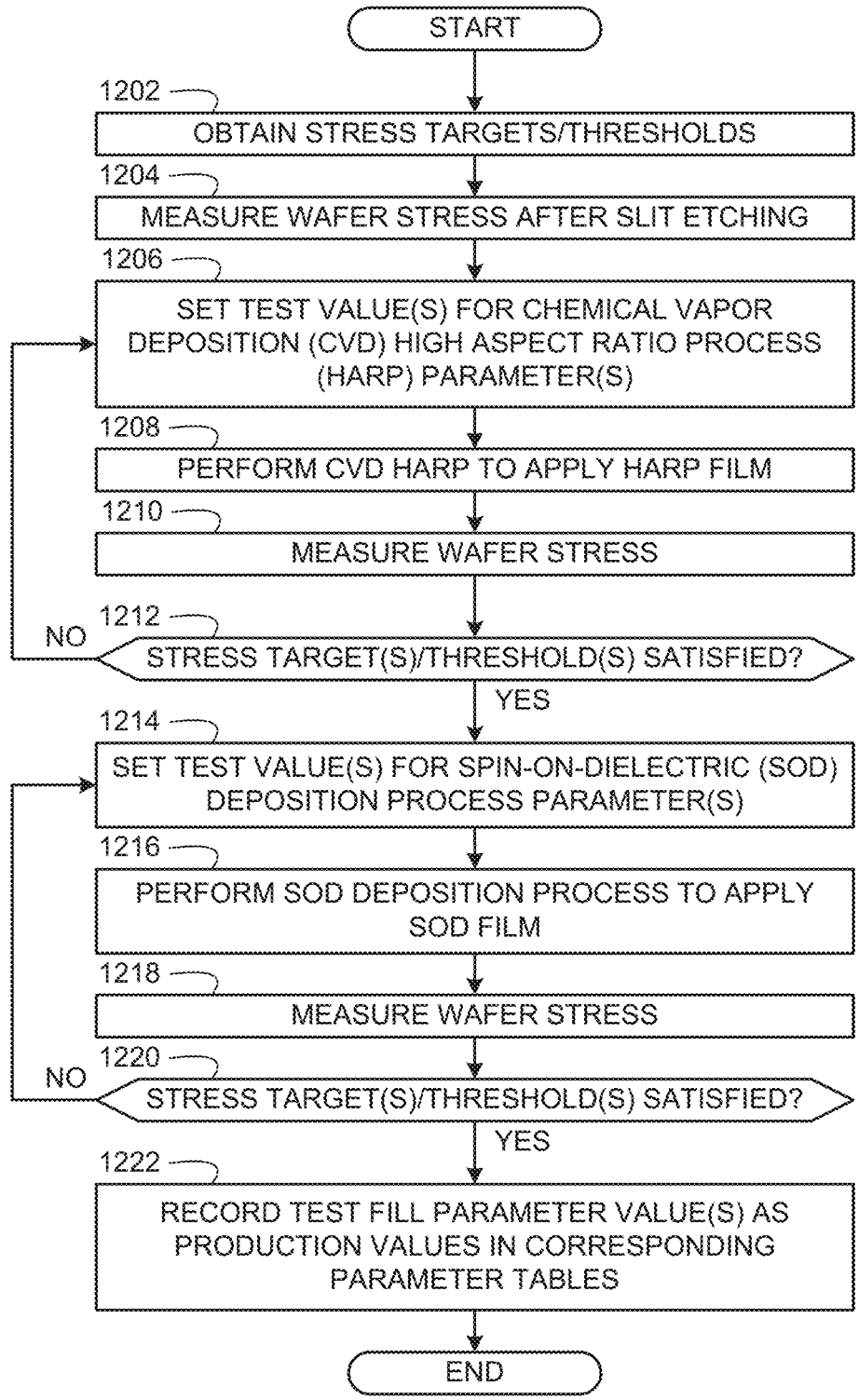
FIG. 12 is a flow diagram representative of example computer readable instructions that may be executed to implement the example fill parameter controller of FIG. 1A to generate fill parameter values for use during wafer fabrication to fill slit structures in monolithic 3D stacked semiconductor substrates.
Figure 13:
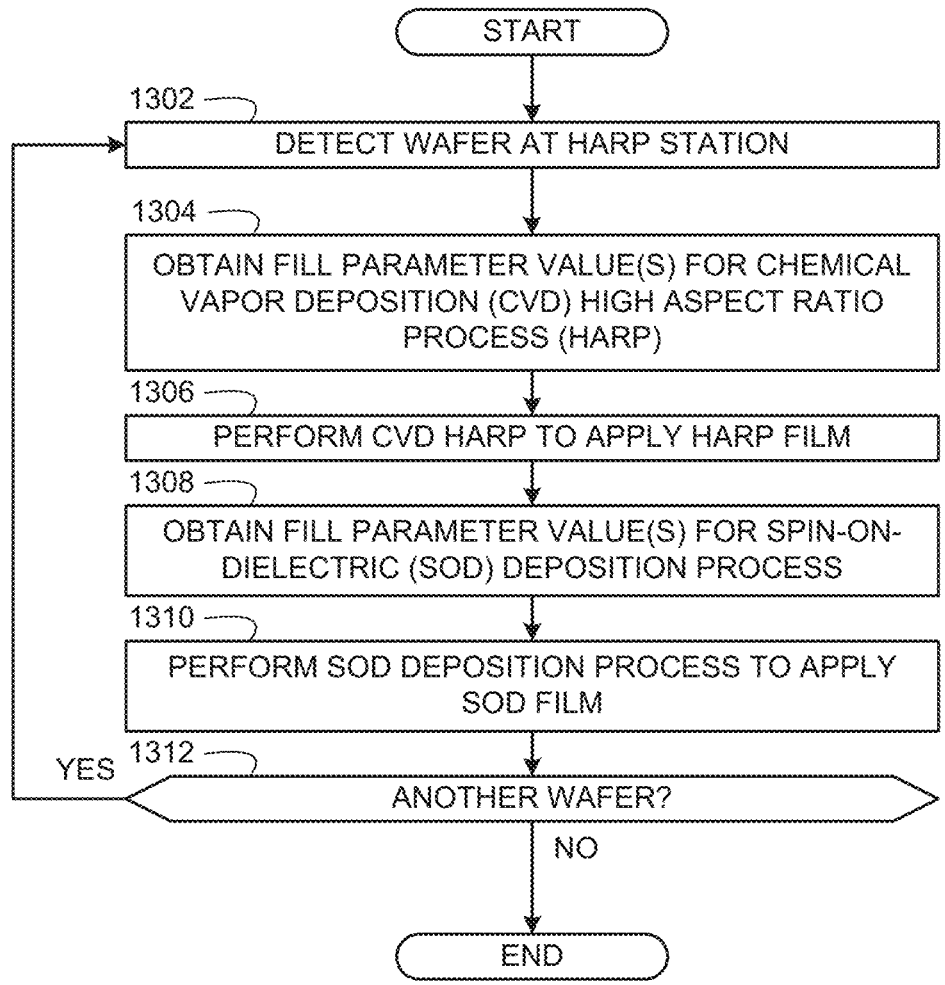
FIG. 13 is a flow diagram representative of example computer readable instructions that may be executed to implement the example slit fill controller of FIG. 1A to fill slit structures in monolithic 3D stacked semiconductor substrates during wafer fabrication.

Flow diagrams representative of example machine readable instructions for implementing the example fill parameter controller 102 and the example slit fill controller 104 of FIG. 1A are shown in FIGS. 12 and 13. In this example, the machine readable instructions include programs for execution by a processor such as the processor 1412 shown in the example processor platform 1400 discussed below in connection with FIG. 14. The programs may be embodied in software stored on a tangible computer readable storage medium such as a CD-ROM, a floppy disk, a hard drive, a digital versatile disk (DVD), a Blu-ray disk, or a memory associated with the processor 1412, but the entire program and/or parts thereof could alternatively be executed by a device other than the processor 1412 and/or embodied in firmware or dedicated hardware. Further, although the example program is described with reference to the flowcharts illustrated in FIGS. 12 and 13, many other methods of implementing the example fill parameter controller 102 and/or the example slit fill controller 104 may alternatively be used. For example, the order of execution of the blocks may be changed, and/or some of the blocks described may be changed, eliminated, or combined.

As mentioned above, the example processes of FIGS. 12 and 13 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example processes of FIGS. 12 and 13 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 12 is a flow diagram representative of example computer readable instructions that may be executed to implement the example fill parameter controller 102 of FIG. 1A to generate values for the fill parameters 132a-c of FIG. 1A for use during wafer fabrication to fill slit structures (e.g., the slit structure 118 of FIGS. 1A and 1B) in monolithic 3D stacked semiconductor substrates (e.g., the semiconductor substrate 108 of FIGS. 1A and 1B). The example process of FIG. 12 may be performed during laboratory phases and/or fabrication set-up phases to set values for the fill parameters 132a-c that create measured global and/or local stresses in the semiconductor substrate 108 that satisfy target or threshold global and/or local stress values. In some examples, numerous iterations of the process of FIG. 12 and/or portions thereof are performed to find suitable values for the fill parameters 132a-c. For example, during the numerous iterations different test values for the fill parameters 132a-c may be tested to determine which of the test values result in acceptable global and/or local stresses across a wafer. In this manner, the selected values for the fill parameters 132a-c can be used during a wafer fabrication process to fill slit structures, such as the example process described below in connection with FIG. 13.

The example of FIG. 12 begins at block 1202 at which the stress monitor 136 (FIG. 1A) obtains stress targets or thresholds. For example, the stress monitor 136 may obtain local and/or global stress targets or thresholds from a data store or user input corresponding to an IC design fabricated on a wafer to be measured. The example stress monitor 136 measures wafer stress after a slit etching operation (block 1204). For example, the stress monitor 136 can measure global and/or local wafer stress of the semiconductor substrate 108 after the slit structure 118 (FIG. 1A) (and/or any other slit structure(s)) is formed in the semiconductor substrate 108. The example fill parameter value generator 138 sets one or more test value(s) for ones of the fill parameters 132a-c that correspond to the CVD HARP process (block 1206). For example, the fill parameter generator 138 can set a test value for a HARP material thickness parameter (e.g., corresponding to the HARP material thickness parameter table 200 of FIG. 2).

The example HARP controller 124 controls the HARP station 112 to perform CVD HARP material deposition to apply a HARP film to the semiconductor substrate 108 (block 1208). In the illustrated example, the HARP controller 124 controls the HARP station 112 using the one or more fill parameter test value(s) set at block 1206. In the illustrated example, the HARP material deposition operation includes densification of the HARP material. The example stress monitor 136 measures the wafer stress of the semiconductor substrate 108 (block 1210). For example, the example stress monitor 136 measures the global and/or local stresses created in the semiconductor substrate 108 as a result of the HARP material deposition process. The example stress monitor 136 determines whether the measured global and/or local stresses satisfy the target or threshold global and/or local stresses (block 1212). For example, the stress monitor 136 compares the measured global and/or local stresses obtained at block 1210 with corresponding ones of the target or threshold global and/or local stresses obtained at block 1202. If the example stress monitor 136 determines at block 1212 that the measured global and/or local stresses do not satisfy the target or threshold global and/or local stresses, control returns to block 1206 at which one or more different test value(s) are set for one or more of the fill parameters 132a-c corresponding to the CVD HARP process so that global and/or local stresses for the new test value(s) can be analyzed. Otherwise, control advances to block 1214.

The example fill parameter value generator 138 sets one or more test value(s) for ones of the fill parameters 132*a-c* that correspond to the SOD process (block 1214). For example, the fill parameter generator 138 can set a test value for a SOD densification temperature parameter (e.g., corresponding to the SOD densification temperature parameter table 300 of FIG. 3) and/or set a test value for a SOD densification time parameter (e.g., corresponding to the SOD densification time parameter table 400 of FIG. 4). The example SOD controller 126 controls the SOD station 114 to perform SOD material deposition to apply a SOD film to the semiconductor substrate 108 (block 1216). In the illustrated example, the SOD controller 126 controls the SOD station 114 using the fill parameter test value(s) set at block 1214. In the illustrated example, the SOD material deposition operation includes densification of the SOD material. The example stress monitor 136 measures the wafer stress of the semiconductor substrate 108 (block 1218). For example, the example stress monitor 136 measures the global and/or local stresses created in the semiconductor substrate 108 as a result of the SOD material deposition process. The example stress monitor 136 determines whether the measured global and/or local stresses satisfy the target or threshold global and/or local stresses (block 1220). For example, the stress monitor 136 compares the measured global and/or local stresses obtained at block 1218 with corresponding ones of the target or threshold global and/or local stresses obtained at block 1202. If the example stress monitor 136 determines at block 1220 that the measured global and/or local stresses do not satisfy the target or threshold global and/or local stresses, control returns to block 1214 at which one or more different test value(s) are set for one or more of the fill parameters 132*a-c* corresponding to the SOD process so that global and/or local stresses for the new test value(s) can be analyzed. Otherwise, control advances to block 1222.

The fill parameter value generator 138 records the test fill parameter value(s) as production fill parameter values in corresponding fill parameter tables (block 1222). For example, the fill parameter value generator 138 stores the test fill parameter values that produced stresses satisfying the target or threshold global and/or local stresses at blocks 1212 and 1220 into corresponding fill parameters 132*a*-132*c*. In some examples, the fill parameters 132*a-c* are stored corresponding parameter tables such as the parameter tables 200-400 of FIGS. 2-4. In this manner, the production values for the fill parameters 132*a-c* can be used by the slit fill controller 104 during a production phase to fill slit structures. After the fill parameter value generator 138 records the test fill parameter value(s) as production fill parameter values at block 1222, the example process of FIG. 12 ends.

FIG. 13 is a flow diagram representative of example computer readable instructions that may be executed to implement the example slit fill controller 104 of FIG. 1A to fill slit structures (e.g., the slit structure 118 of FIGS. 1A and 1B) in monolithic 3D stacked semiconductor substrates (e.g., the semiconductor substrate 108 of FIGS. 1A and 1B). In the illustrated example, process of FIG. 13 is performed during a production phase using the fill parameter values generated in the process of FIG. 12 to perform a hybrid HARP material and SOD material fill process of slit structures.

The example of FIG. 13 begins when the HARP controller 124 (FIG. 1A) detects a wafer at the HARP station 112 (FIG. 1A) (block 1302). For example, the HARP controller 124 detects the semiconductor substrate 108 (FIG. 1A) at the HARP station 112 after the semiconductor substrate 108 undergoes etching at the etch station 110 (FIG. 1A) to form slit structures such as the slit structure 118. The example HARP controller 124 obtains one or more fill parameter value(s) to perform the CVD HARP process (block 1304). For example, the HARP controller 124 accesses the fill parameter store 130 to obtain the HARP fill parameter production value(s) from one or more of the fill parameter(s) 132*a-c*. The HARP controller 124 controls the HARP station 112 to perform CVD HARP material deposition to apply a HARP film to the semiconductor substrate 108 (block 1306). In the illustrated example, the HARP controller 124 controls the HARP station 112 using the one or more HARP fill parameter production value(s) obtained at block 1304. In the illustrated example, the HARP material deposition operation includes densification of the HARP material.

The example SOD controller 126 obtains one or more fill parameter value(s) to perform the SOD process (block 1308). For example, the SOD controller 126 accesses the fill parameter store 130 to obtain the SOD fill parameter production value(s) from one or more of the fill parameter(s) 132*a-c*. The example SOD controller 126 controls the SOD station 114 to perform SOD material deposition to apply a SOD film to the semiconductor substrate 108 (block 1310). In the illustrated example, the SOD controller 126 controls the SOD station 114 using the SOD fill parameter production value(s) obtained at block 1308. In the illustrated example, the SOD material deposition operation includes densification of the SOD material.

The example slit fill controller 104 determines whether there is another wafer to process (block 1312). If there is another wafer to process, control returns to block 1302. Otherwise, the example process of FIG. 13 ends.

Figure 14:
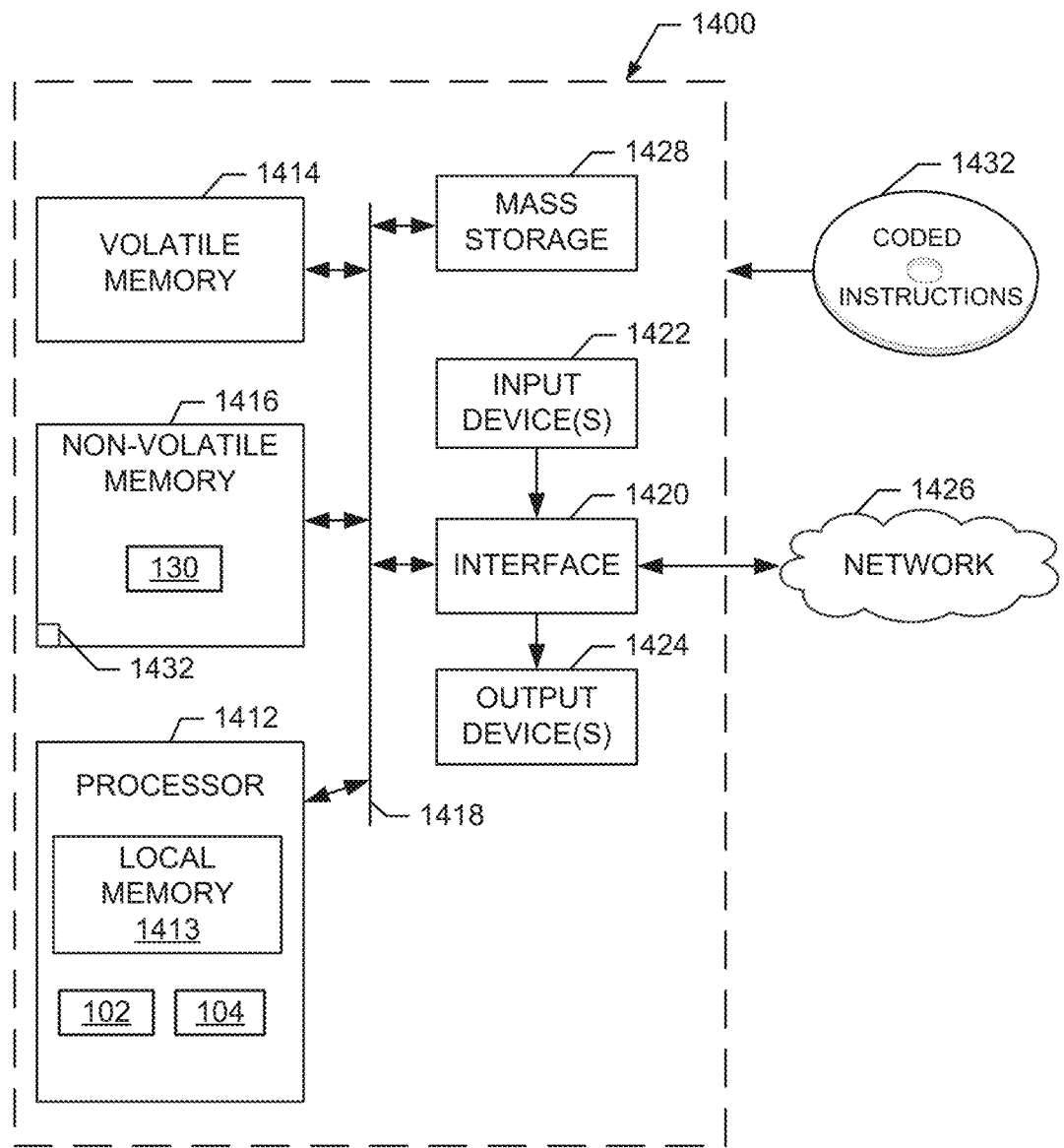
FIG. 14 is an example processor platform capable of executing the example computer readable instructions represented by FIGS. 12 and 13 to implement the example fill parameter controller and/or the example slit fill controller of FIG. 1A to fill slit formations in monolithic 3D stacked transistor layer structures during wafer fabrication in accordance with the teachings of this disclosure.

FIG. 14 is a block diagram of an example processor platform 1400 capable of executing the instructions of FIGS. 12 and/or 13 to implement the example fill parameter controller 102, the example slit fill controller 104, and/or the example fill parameter store 130 of FIG. 1A. The processor platform 1400 can be, for example, a server, a personal computer, a workstation, a terminal, a process controller, or any other type of computing device.

The processor platform 1400 of the illustrated example includes a processor 1412. The processor 1412 of the illustrated example is hardware. For example, the processor 1412 can be implemented by one or more integrated circuits, logic circuits, microprocessors or controllers from any desired family or manufacturer. In the illustrated example, the example fill parameter controller 102 and the example slit fill controller 104 are implemented by the processor 1412.

The processor 1412 of the illustrated example includes a local memory 1413 (e.g., a cache). The processor 1412 of the illustrated example is in communication with a main memory including a volatile memory 1414 and a non-volatile memory 1416 via a bus 1418. The volatile memory 1414 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 1416 may be implemented by flash memory and/or any other desired type of memory device. Access to the main memory 1414, 1416 is controlled by one or more memory controllers. In the illustrated example of FIG. 14, the example fill parameter store 130 is shown as being implemented in the non-volatile memory 1416. Additionally or alternatively, the example fill parameter store 130 may be implemented in the volatile memory 1414. In other examples, the example fill parameter store 130 may be implemented separate from the non-volatile memory 1416 (and/or the volatile memory 1414) and communicatively coupled with the processor platform 1400 via an external bus interface or a network interface.

The processor platform 1400 of the illustrated example also includes an interface circuit 1420. The interface circuit 1420 may be implemented by any type of interface standard, such as an Ethernet interface, a universal serial bus (USB), and/or a PCI express interface.

In the illustrated example, one or more input devices 1422 are connected to the interface circuit 1420. The input device(s) 1422 permit(s) a user to enter data and commands into the processor 1412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1424 are also connected to the interface circuit 1420 of the illustrated example. The output devices 1424 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 1420 of the illustrated example, thus, typically includes a graphics driver card, a graphics driver chip or a graphics driver processor.

The interface circuit 1420 of the illustrated example also includes a communication device such as a transmitter, a receiver, a transceiver, a modem and/or network interface card to facilitate exchange of data with external machines (e.g., computing devices of any kind) via a network 1426 (e.g., an Ethernet connection, a digital subscriber line (DSL), a telephone line, coaxial cable, a cellular telephone system, etc.).

The processor platform 1400 of the illustrated example also includes one or more mass storage devices 1428 for storing software and/or data. Examples of such mass storage devices 1428 include floppy disk drives, hard drive disks, compact disk drives, Blu-ray disk drives, RAID systems, and digital versatile disk (DVD) drives.

Coded instructions 1432 for use by the example fill parameter controller 102 and/or the example slit fill controller 104 to implement the example processes of FIG. 12 and/or FIG. 13 may be stored in the non-volatile memory 1416, and/or on a removable tangible computer readable storage medium such as a CD or DVD.

From the foregoing, it will be appreciated that the above disclosed examples are useful to substantially reduce or eliminate failure rates in 3D stacked semiconductor substrates during a wafer fabrication process that otherwise arise from poorly filled slit structures. Disclosed hybrid fill techniques for filling slit structures using a combination of HARP material and SOD material can be advantageously used to control global and/or local stresses based on respective tensile and compressive characteristics of each of the HARP material and the SOD material. In this manner, different fill parameters for controlling HARP material deposition and SOD material deposition can be used to control how the deposited HARP material affects global and/or local stresses and how the SOD material affects the global and/or local stresses. In addition, fill parameters for controlling HARP material deposition and SOD material deposition can be selected to facilitate solid fillings of slit structures to prevent sealed air gaps or voids that could otherwise cause blowouts, bitline-to-bitline (BL-BL) shorts, and/or contact-to-pillar misalignment, resulting in high failure rates of IC die across wafers.

The following pertain to further examples disclosed herein.

Example 1 is a method to modulate slit stress in a semiconductor substrate. The method of example 1 includes controlling a first process to apply a first material to a semiconductor substrate, the semiconductor substrate including a slit between adjacent stacked transistor layers, the first material coating walls of the slit to reduce a first width of the slit between the adjacent stacked transistor layers to a second width; and controlling a second process to apply a second material to the semiconductor substrate, the second material to be deposited in the second width of the slit, the first material and the second material to form a solid structure in the slit between the adjacent stacked transistor layers.

In Example 2, the subject matter of Example 1 can optionally include that the controlling of the first process is based on a material thickness parameter to control a thickness of the first material by controlling a quantity of the first material deposited by the first process.

In Example 3, the subject matter of any one of Examples 1-2 can optionally include that a value for the material thickness parameter is selected to modulate at least one of global stress across the semiconductor substrate or local stress surrounding the slit between the adjacent stacked transistor layers.

In Example 4, the subject matter of any one of Examples 1-3 can optionally include that a value for the material thickness parameter is selected to prevent the first material from forming a pinch-off structure in the slit.

In Example 5, the subject matter of any one of Examples 1-4 can optionally include that the controlling of the first process includes controlling the first process to apply the first material without forming a pinch-off structure in the slit with the first material.

In Example 6, the subject matter of any one of Examples 1-5 can optionally include that the controlling of the second process is based on a densification temperature parameter to set a temperature used to densify the second material.

In Example 7, the subject matter of any one of Examples 1-6 can optionally include that the controlling of the second process is based on a densification time parameter to control a duration of a densification phase to densify the second material.

In Example 8, the subject matter of any one of Examples 1-7 can optionally include that the first process is a chemical vapor deposition (CVD) high aspect ratio process (HARP), and the second process is a spin-on-dielectric (SOD) process.

In Example 9, the subject matter of any one of Examples 1-8 can optionally include that the first process is a spin-on-dielectric (SOD) process, and the second process is a chemical vapor deposition (CVD) high aspect ratio process (HARP).

In Example 10, the subject matter of any one of Examples 1-9 can optionally include that the adjacent stacked transistor layers are configured in a three dimensional (3D) stacked configuration.

Example 11 is an apparatus to modulate slit stress in a semiconductor substrate. The apparatus of Example 11 includes a first controller to control a first process to apply a first material to a semiconductor substrate, the semiconductor substrate including a slit between adjacent stacked transistor layers, the first material coating walls of the slit to reduce a first width of the slit between the adjacent stacked transistor layers to a second width; and a second controller to control a second process to apply a second material to the semiconductor substrate, the second material to be deposited in the second width of the slit, the first material and the second material to form a solid structure in the slit between the adjacent stacked transistor layers.

In Example 12, the subject matter of Example 11 can optionally include that the first controller controls the first process based on a material thickness parameter to control a thickness of the first material by controlling a quantity of the first material deposited by the first process.

In Example 13, the subject matter of any one of Examples 11-12 can optionally include that a value for the material thickness parameter is selected to modulate at least one of global stress across the semiconductor substrate or local stress surrounding the slit between the adjacent stacked transistor layers.

In Example 14, the subject matter of any one of Examples 11-13 can optionally include a stress monitor to monitor the at least one of the global stress or the local stress; and a fill parameter value generator to select the value for the material thickness parameter when the at least one of the global stress or the local stress satisfy at least one of a threshold global stress or a threshold local stress.

In Example 15, the subject matter of any one of Examples 11-14 can optionally include that a value for the material thickness parameter is selected to prevent the first material from forming a pinch-off structure in the slit.

In Example 16, the subject matter of any one of Examples 11-15 can optionally include that the first controller controls the first process to apply the first material without forming a pinch-off structure in the slit with the first material.

In Example 17, the subject matter of any one of Examples 11-16 can optionally include that the second controller controls the second process based on a densification temperature parameter to set a temperature used to densify the second material.

In Example 18, the subject matter of any one of Examples 11-17 can optionally include that the second controller controls the second process based on a densification time parameter to control a duration of a densification phase to densify the second material.

In Example 19, the subject matter of any one of Examples 11-18 can optionally include that the first process is a chemical vapor deposition (CVD) high aspect ratio process (HARP), and the second process is a spin-on-dielectric (SOD) process.

In Example 20, the subject matter of any one of Examples 11-19 can optionally include that the first process is a spin-on-dielectric (SOD) process, and the second process is a chemical vapor deposition (CVD) high aspect ratio process (HARP).

In Example 21, the subject matter of any one of Examples 11-20 can optionally include that the adjacent stacked transistor layers are configured in a three dimensional (3D) stacked configuration.

In Example 22, the subject matter of any one of Examples 11-21 can optionally include that the first controller and the second controller are implemented using one processor.

Example 23 is at least one article of manufacture comprising machine readable instructions that, when executed, cause a processor to at least control a first process to apply a first material to a semiconductor substrate, the semiconductor substrate including a slit between adjacent stacked transistor layers, the first material coating walls of the slit to reduce a first width of the slit between the adjacent stacked transistor layers to a second width; and control a second process to apply a second material to the semiconductor substrate, the second material to be deposited in the second width of the slit, the first material and the second material to form a solid structure in the slit between the adjacent stacked transistor layers.

In Example 24, the subject matter of Example 23 can optionally include that the instructions are to cause the processor to control the first process based on a material thickness parameter to control a thickness of the first material by controlling a quantity of the first material deposited by the first process.

In Example 25, the subject matter of any one of Examples 23-24 can optionally include that a value for the material thickness parameter is selected to modulate at least one of global stress across the semiconductor substrate or local stress surrounding the slit between the adjacent stacked transistor layers.

In Example 26, the subject matter of any one of Examples 23-25 can optionally include that a value for the material thickness parameter is selected to prevent the first material from forming a pinch-off structure in the slit.

In Example 27, the subject matter of any one of Examples 23-26 can optionally include that the instructions are to cause the processor to control the first process to apply the first material without forming a pinch-off structure in the slit with the first material.

In Example 28, the subject matter of any one of Examples 23-27 can optionally include that the instructions are to cause the processor to control the second process based on a densification temperature parameter to set a temperature used to densify the second material.

In Example 29, the subject matter of any one of Examples 23-28 can optionally include that the instructions are to cause the processor to control the second process based on a densification time parameter to control a duration of a densification phase to densify the second material.

In Example 30, the subject matter of any one of Examples 23-29 can optionally include that the first process is a chemical vapor deposition (CVD) high aspect ratio process (HARP), and the second process is a spin-on-dielectric (SOD) process.

In Example 31, the subject matter of any one of Examples 23-30 can optionally include that the first process is a spin-on-dielectric (SOD) process, and the second process is a chemical vapor deposition (CVD) high aspect ratio process (HARP).

In Example 32, the subject matter of any one of Examples 23-31 can optionally include that the adjacent stacked transistor layers are configured in a three dimensional (3D) stacked configuration.

Example 33 is an apparatus to modulate slit stress in a semiconductor substrate. The apparatus of Example 33 includes means for controlling a first process to apply a first material to a semiconductor substrate, the semiconductor substrate including a slit between adjacent stacked transistor layers, the first material coating walls of the slit to reduce a first width of the slit between the adjacent stacked transistor layers to a second width; and means for controlling a second process to apply a second material to the semiconductor substrate, application of the second material to be deposited in the second width of the slit, the first material and the second material to form a solid structure in the slit between the adjacent stacked transistor layers.

In Example 34, the subject matter of Example 33 can optionally include that the means for controlling the first process uses a material thickness parameter to control a thickness of the first material by controlling a deposited quantity of the first material.

In Example 35, the subject matter of any one of Examples 33-34 can optionally include that a value for the material thickness parameter is selected to modulate at least one of global stress across the semiconductor substrate or local stress surrounding the slit between the adjacent stacked transistor layers.

In Example 36, the subject matter of any one of Examples 33-35 can optionally include means for monitoring the at least one of the global stress or the local stress; and means for selecting the value for the material thickness parameter when the at least one of the global stress or the local stress satisfy at least one of a threshold global stress or a threshold local stress.

In Example 37, the subject matter of any one of Examples 33-36 can optionally include that a value for the material thickness parameter is selected to prevent the first material from forming a pinch-off structure in the slit.

In Example 38, the subject matter of any one of Examples 33-37 can optionally include that the means for controlling the first process is to control applying of the first material without forming a pinch-off structure in the slit with the first material.

In Example 39, the subject matter of any one of Examples 33-38 can optionally include that the means for controlling the second process uses a densification temperature parameter to set a temperature used to densify the second material.

In Example 40, the subject matter of any one of Examples 33-39 can optionally include that the means for controlling the second process uses a densification time parameter to control a duration of a densification phase to densify the second material.

In Example 41, the subject matter of any one of Examples 33-40 can optionally include that the first process is a chemical vapor deposition (CVD) high aspect ratio process (HARP), and the second process is a spin-on-dielectric (SOD) process.

In Example 42, the subject matter of any one of Examples 33-41 can optionally include that the first process is a spin-on-dielectric (SOD) process, and the second process is a chemical vapor deposition (CVD) high aspect ratio process (HARP).

In Example 43, the subject matter of any one of Examples 33-42 can optionally include that the adjacent stacked transistor layers are configured in a three dimensional (3D) stacked configuration.

Example 44 is an integrated circuit die. The integrated circuit die of Example 44 includes first and second stacked transistor layer structures; a slit structure interposing the first and second stacked transistor layer structures; a first fill material applied to first sidewalls of the slit structure; and a second fill material applied to second sidewalls created by the first fill material in the slit structure.

In Example 45, the subject matter of Example 44 can optionally include that the first fill material reduces the width of the slit structure from a first width to a narrower, second width defined by the second sidewalls.

In Example 46, the subject matter of any one of Examples 44-45 can optionally include that the first fill material and the second fill material create a solid electrically insulating structure in the slit structure.

In Example 47, the subject matter of any one of Examples 44-46 can optionally include that the solid electrically insulating structure fills the slit structure without air gaps in the slit structure.

In Example 48, the subject matter of any one of Examples 44-47 can optionally include that the first fill material is a high aspect ratio process (HARP) fill material, and the second fill material is a spin-on-dielectric (SOD) fill material.

In Example 49, the subject matter of any one of Examples 44-48 can optionally include that the first fill material is a spin-on-dielectric (SOD) process, and the second fill material is a chemical vapor deposition (CVD) high aspect ratio process (HARP).

In Example 50, the subject matter of any one of Examples 44-49 can optionally include that the first and second stacked transistor layer structures, the slit structure, and the first and second fill materials are located in a chip package.

In Example 51, the subject matter of any one of Examples 44-50 can optionally include that the stacked transistor layer structures form 3D NAND flash memory cells.

In Example 52, the subject matter of any one of Examples 44-51 can optionally include one or more processors communicatively coupled to the integrated circuit die; a network interface communicatively coupled to the integrated circuit die; or a display communicatively coupled to the integrated circuit die.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus to modulate slit stress in a semiconductor substrate, the apparatus comprising:
    a first controller to, after obtaining a wafer stress measurement of the semiconductor substrate, control application of a first material to the semiconductor substrate based on the wafer stress measurement to coat walls of a slit between adjacent stacked transistor layers of the semiconductor substrate to reduce a first width of the slit to a second width; and
    a second controller to control application of a second material to the semiconductor substrate to deposit the second material in the second width of the slit to form a solid structure by the first material and the second material in the slit between the adjacent stacked transistor layers.

2. An apparatus of claim 1, wherein the first controller is to control a thickness of the first material based on a material thickness parameter.

3. An apparatus of claim 2, further including a fill parameter value generator to select a value for the material thickness parameter to modulate at least one of global stress across the semiconductor substrate or local stress surrounding the slit between the adjacent stacked transistor layers.

4. An apparatus of claim 3, further including a stress monitor to monitor the at least one of the global stress or the local stress, the fill parameter value generator to select the value for the material thickness parameter when the at least one of the global stress or the local stress satisfy at least one of a threshold global stress or a threshold local stress.

5. An apparatus of claim 2, further including a fill parameter value generator to select a value for the material thickness parameter to prevent the first material from forming a pinch-off structure in the slit.

6. An apparatus of claim 1, wherein the first controller is to control the application of the first material without forming a pinch-off structure in the slit with the first material.

7. An apparatus of claim 1, wherein the second controller is to control the application of the second material based on a densification temperature parameter to set a temperature used to densify the second material.

8. An apparatus of claim 1, wherein the second controller is to control the application of the second material based on a densification time parameter to control a duration of a densification phase to densify the second material.

9. An apparatus of claim 1, wherein the first controller is to control the application of the first material by a chemical vapor deposition (CVD) high aspect ratio process (HARP), and the second controller is to control the application of the second material by a spin-on-dielectric (SOD) process.

10. An apparatus of claim 1, wherein the adjacent stacked transistor layers are configured in a three dimensional (3D) stacked configuration.

11. An apparatus of claim 1, wherein the first controller and the second controller are implemented using one processor.

12. An apparatus to modulate slit stress in a semiconductor substrate, the apparatus comprising:
   first means for controlling to, after obtaining a wafer stress measurement of the semiconductor substrate, control application of a first material to the semiconductor substrate based on the wafer stress measurement to coat walls of a slit between adjacent stacked transistor layers of the semiconductor substrate to reduce a first width of the slit to a second width; and
   second means for controlling application of a second material to the semiconductor substrate to deposit the second material in the second width of the slit to form a solid structure by the first material and the second material in the slit between the adjacent stacked transistor layers.

13. An apparatus of claim 12, wherein the first means for controlling is to control a thickness of the first material by depositing the first material based on a material thickness parameter.

14. An apparatus of claim 13, further including means for selecting a value for the material thickness parameter to modulate at least one of global stress across the semiconductor substrate or local stress surrounding the slit between the adjacent stacked transistor layers.

15. An apparatus of claim 14, further including means for monitoring the at least one of the global stress or the local stress, the means for selecting the value for the material thickness parameter to select the value for the material thickness parameter when the at least one of the global stress or the local stress satisfy at least one of a threshold global stress or a threshold local stress.

16. An apparatus of claim 13, further including means for selecting a value for the material thickness parameter to prevent the first material from forming a pinch-off structure in the slit.

17. An apparatus of claim 12, wherein the first means for controlling is to control the application of the first material without forming a pinch-off structure in the slit with the first material.

18. An apparatus of claim 12, wherein the second means for controlling is to use a densification temperature parameter to set a temperature used to densify the second material.

19. An apparatus of claim 12, wherein the second means for controlling is to use a densification time parameter to control a duration of a densification phase to densify the second material.

20. An apparatus of claim 12, wherein the first means for controlling is to control the application of the first material by a chemical vapor deposition (CVD) high aspect ratio process (HARP), and the second means for controlling is to control the application of the second material by a spin-on-dielectric (SOD) process.

21. An apparatus of claim 12, wherein the adjacent stacked transistor layers are configured in a three dimensional (3D) stacked configuration.

* * * * *